(12) United States Patent
Murakami

(10) Patent No.: US 10,231,327 B1
(45) Date of Patent: Mar. 12, 2019

(54) OPTICAL MODULE AND OPTICAL TRANSMISSION EQUIPMENT

(71) Applicant: Oclaro Japan, Inc., Kanagawa (JP)

(72) Inventor: Daisuke Murakami, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 16/011,666

(22) Filed: Jun. 19, 2018

(30) Foreign Application Priority Data

Dec. 28, 2017 (JP) ................................. 2017-254032

(51) Int. Cl.
*H05K 1/02* (2006.01)
*H05K 1/11* (2006.01)
*H05K 1/18* (2006.01)
*G02B 6/13* (2006.01)

(52) U.S. Cl.
CPC ............. *H05K 1/0274* (2013.01); *G02B 6/13* (2013.01); *H05K 1/112* (2013.01); *H05K 1/118* (2013.01); *H05K 1/189* (2013.01)

(58) Field of Classification Search
CPC ...... H05K 1/0274; H05K 1/111–1/113; H05K 1/117; H05K 1/118; H05K 1/14
See application file for complete search history.

(56) References Cited

U.S. PATENT DOCUMENTS

| | | | | |
|---|---|---|---|---|
| 6,040,524 A * | 3/2000 | Kobayashi | ........... | H05K 1/0219 174/262 |
| 6,281,451 B1 * | 8/2001 | Chan | .................... | H01B 7/0861 174/262 |
| 6,797,891 B1 * | 9/2004 | Blair | ...................... | H05K 1/147 174/110 R |
| 2004/0164882 A1 * | 8/2004 | Touyama | .............. | G10L 19/032 341/51 |
| 2007/0012774 A1 * | 1/2007 | Cho | ...................... | H05K 1/0216 235/435 |
| 2010/0085326 A1 * | 4/2010 | Anno | ...................... | G06F 3/044 345/174 |
| 2010/0215324 A1 * | 8/2010 | Ban | ....................... | G02B 6/4201 385/88 |
| 2011/0294340 A1 * | 12/2011 | Kojima | ................ | H01R 12/598 439/497 |

(Continued)

FOREIGN PATENT DOCUMENTS

| | | |
|---|---|---|
| JP | 2014-143543 A | 8/2014 |
| JP | 2017-092319 A | 5/2017 |

*Primary Examiner* — Hoa C Nguyen
(74) *Attorney, Agent, or Firm* — Mattingly & Malur, PC

(57) ABSTRACT

There is provided an optical module including an optical subassembly including an optical element, a printed circuit board, and a connection substrate. The connection substrate includes a first connection portion connected to a first signal line conductor strip disposed on a first surface and a first ground conductor layer disposed on a second surface. The first connection portion includes a first signal line pad portion, a first ground pad portion, both disposed on the first surface, a second signal line pad portion disposed, and a second ground pad portion, both disposed on the second surface. In the connection substrate, a distance between the first signal line pad portion and the first ground pad portion in a first region is narrower than that in a second region farther from an inner end portion on the gap portion side than the first region in plan view.

10 Claims, 20 Drawing Sheets

(56) References Cited

U.S. PATENT DOCUMENTS

| | | | |
|---|---|---|---|
| 2012/0138340 A1* | 6/2012 | Kato | H05K 1/028 174/251 |
| 2013/0108210 A1* | 5/2013 | Uemura | G02B 6/43 385/14 |
| 2014/0014409 A1* | 1/2014 | Lin | H02G 15/08 174/75 R |
| 2014/0085856 A1* | 3/2014 | Shirao | H05K 1/0251 361/803 |
| 2017/0139160 A1 | 5/2017 | Noguchi et al. | |

* cited by examiner

OPTICAL MODULE AND OPTICAL TRANSMISSION EQUIPMENT

CROSS-REFERENCE TO RELATED APPLICATION

The present application claims priority from Japanese application JP 2017-254032, filed on Dec. 28, 2017, the content of which is hereby incorporated by reference into this application.

BACKGROUND OF THE INVENTION

1. Field of the Invention

The present invention relates to an optical module and an optical transmission equipment, and in particular, to a technique for suppressing mismatching of characteristic impedance.

2. Description of the Related Art

A connection substrate for connecting an optical subassembly (OSA) and a printed circuit board (PCB) is used in an optical module. Here, as the connection substrate, flexible printed circuits (FPC) are exemplified. A high frequency transmission line is disposed on the connection substrate and a high frequency electric signal is transmitted to the high frequency transmission line. A width of a signal line and a distance between the signal line and a ground conductor layer are set so that the signal line and the ground conductor layer constituting the high frequency transmission line of the connection substrate have desired characteristic impedance (for example, 50Ω).

In a connected part between the optical subassembly and the connection substrate and a connected part between the printed circuit board and the connection substrate, the optical subassembly and the connection substrate connected to each other and the printed circuit board and the connection substrate are connected to each other by soldering or the like, but in order to secure strength of the connected parts, widths of terminals of the connected parts may be set wider than a line width of the signal line of the connection board in some cases. In this case, impedance mismatching occurs at the connected parts, which may degrade optical waveform quality of the optical module. In JP2017-092319 A and JP2014-143543 A, a technique of reducing impedance mismatching in a connection portion is disclosed.

SUMMARY OF THE INVENTION

In the technique described in JP2017-092319 A and JP2014-143543 A, means for changing shapes of the ground conductor layers of the flexible printed circuits and means for changing wiring patterns of the signal lines of the flexible printed circuits are adopted. However, with these means, it is impossible to sufficiently reduce impedance mismatching or it is difficult to miniaturize the flexible printed circuits, such as securing a region of the wiring pattern of the signal line in order to realize reduction of impedance mismatching.

The present invention has been made in view of the problems described above, and has an object to provide an optical module and an optical transmission equipment which make suppression of impedance mismatching compatible with miniaturization.

(1) In order to solve the problems described above, according to an aspect of the present invention, there is provided an optical module which includes an optical subassembly including one or a plurality of optical elements, a printed circuit board including a control circuit for controlling the one or a plurality of optical elements, and a connection substrate for connecting the optical subassembly and the printed circuit board. The connection substrate has a first surface and a second surface and includes: a first signal line conductor strip disposed on one of the first surface and the second surface; a first ground conductor layer disposed on the other of the first surface and the second surface, overlapped with the first signal line conductor strip, and formed to spread further outward on both sides of the first signal line conductor strop; and a first connection portion connected to one of the printed circuit board and the optical subassembly, on the second surface. The first connection portion includes: a first signal line pad portion disposed on the first surface; a first ground pad portion disposed adjacent to the first signal line pad portion on the first surface; a second signal line pad portion disposed on the second surface and electrically connected to the first signal line pad portion; and a second ground pad portion disposed adjacent to the second signal line pad portion on the second surface and electrically connected to the first ground pad portion. The first signal line conductor strip is physically in contact with one of the first signal line pad portion and the second signal line pad portion, being disposed on the one of the first surface and the second surface. The ground conductor layer is physically in contact with one of the first ground pad portion and the second ground pad portion, being disposed on the other of the first surface and the second surface. The connection substrate includes a gap portion electrically isolating from the ground conductor layer the other of the first signal line pad portion and the second signal line pad portion, being disposed on the other of the first surface and the second surface. A distance between the first signal line pad portion and the first ground pad portion in a first region is narrower than that in a second region that is farther from an inner end portion on the gap portion side than the first region in plan view.

(2) In the optical module described in (1) described above, an edge of the first signal line pad portion may be located outside an edge of the second signal line pad portion in the first region in plan view.

(3) In the optical module described in (1) or (2) described above, the edge of the first signal line pad portion may be located inside the edge of the second signal line pad portion in the second region in plan view.

(4) In the optical module described in any one of (1) to (3) described above, an edge of the first ground pad portion may be located outside an edge of the second ground pad portion in the first region in plan view.

(5) In the optical module described in any one of (1) to (4) described above, the edge of the first ground pad portion may be located inside the edge of the second ground pad portion in the second region in plan view.

(6) In the optical module described in any one of (1) to (5) described above, the one of the printed circuit board and the optical subassembly may have a third surface opposed to the first surface of the connection substrate and may include: a third signal line pad portion disposed on the third surface and connected in contact with the second signal pad portion; and a third ground pad portion disposed on the third surface and connected in contact with the second ground pad portion. A shape of the second signal line pad portion may correspond to a shape of the third signal pad portion and the second signal line pad portion may be connected so as to overlap the third signal pad portion. A shape of the second ground pad portion may correspond to a shape of the third ground pad portion and the second ground pad portion may be connected so as to overlap the third ground pad portion.

(7) In the optical module described in (6) described above, both the second signal line pad portion and the second ground pad portion may have a rectangular shape.

(8) In the optical module described in any one of (1) to (7) described above, the connection substrate may further include a plurality of the first signal line conductor strips disposed on the one of the first surface and the second surface. In the first connection portion, a plurality of the first signal line pad portions disposed on the first surface, a plurality of the first ground pad portions disposed on the first surface, a plurality of the second signal line pad portions disposed on the second surface, and a plurality of the second ground pad portions disposed on the second surface are provided. The first signal line pad portion and the first ground pad portion may be disposed repeatedly a plurality of times to be aligned in this order on the first surface. The second signal line pad portion and the second ground pad portion may be disposed repeatedly a plurality of times to be aligned in this order on the second surface. The plurality of the first signal line pad portions may be electrically connected to the plurality of the second signal line pad portions, respectively. The plurality of the first ground pad portions may be electrically connected to the plurality of the second ground pad portions, respectively. The plurality of the first signal line conductor strips may be physically in contact with one of the plurality of the first signal line pad portions and the plurality of the second signal line pad portions, being disposed on the one of the first surface and the second surface, respectively. The ground conductor layer may be physically in contact with one of the plurality of the first ground pad portions and the plurality of the second ground pad portions, being disposed on the other of the first surface and the second surface. The connection substrate may further include a plurality of the gap portions electrically isolating from the ground conductor layer the other of the plurality of the first signal line pad portions and the plurality of the second signal line pad portions, being disposed on the other of the first surface and the second surface. each of distances between the first signal line pad portions and the first ground pad portions adjacent to each other in a first region may be narrower than that in a second region that is farther from an inner end portion on the gap portion side than the first region in plan view.

(9) In the optical module described in any one of (1) to (7) described above, the connection substrate may further include a plurality of the first signal line conductor strips disposed on the one of the first surface and the second surface. In the first connection portion, a plurality of the first signal line pad portions disposed on the first surface, two of the first ground pad portions disposed on the first surface, a plurality of the second signal line pad portions disposed on the second surface, and two of the second ground pad portions disposed on the second surface, are provided. One of the two of the first ground pad portions, the plurality of the first signal line pad portions, and the other of the two of the first ground pad portions may be disposed to be aligned in this order on the first surface. One of the two of the second ground pad portions, the plurality of the second signal line pad portions, and the other of the two of the second ground pad portions may be disposed to be aligned in this order on the second surface. The plurality of the first signal line pad portions may be electrically connected to the plurality of the second signal line pad portions, respectively. The two of the first ground pad portions may be electrically connected to the two of the second ground pad portions, respectively. The plurality of the first signal line conductor strips may be physically in contact with one of the plurality of the first signal line pad portions and the plurality of the second signal line pad portions, being disposed on the one of the first surface and the second surface, respectively. The ground conductor layer may be physically in contact with one of the two of the first ground pad portions and the two of the second ground pad portions, being disposed on the other of the first surface and the second surface, respectively. The connection substrate may further include a plurality of the gap portions electrically isolating from the ground conduct layer the other of the plurality of the first signal line pad portions and the plurality of the second signal line pad portions, being disposed on the other of the first surface and the second surface, respectively. Each of distances between the first signal line pad portions and the first ground pad portions adjacent to each other in a first region may be narrower than that in a second region that is farther from an inner end portion on the gap portion side than the first region in plan view.

(10) According to another aspect of the present invention, there is provided an optical transmission equipment on which the optical module according to any one of (1) to (9) described above is mounted.

According to aspects of the present invention, there is provided an optical module and an optical transmission equipment which are compatible with suppression of impedance mismatching and miniaturization.

DETAILED DESCRIPTION OF THE INVENTION

Figure 1:
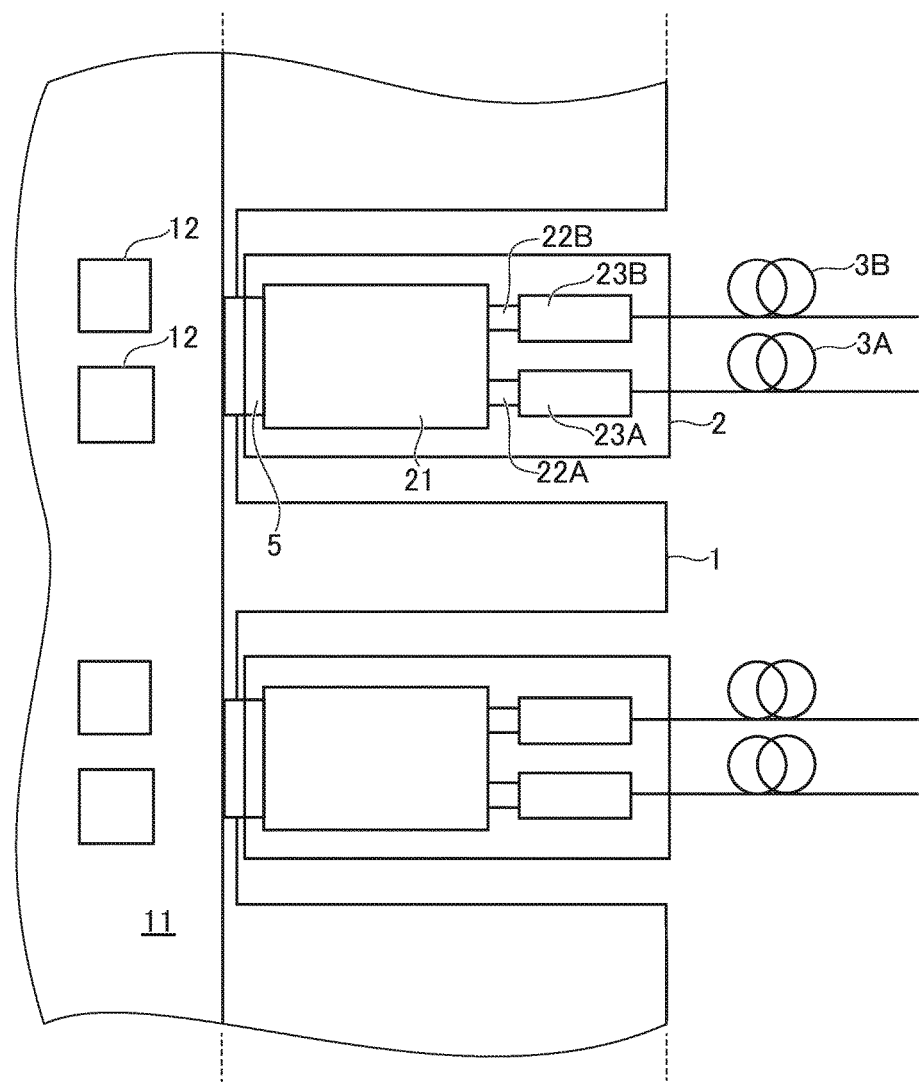
FIG. 1 is a schematic view showing a configuration of an optical transmission equipment and an optical module according to a first embodiment of the present invention.

Hereinafter, embodiments of the present invention will be described specifically and in detail with reference to the drawings. In all the drawings for describing the embodiments, the same reference numerals are given to the members having the same function, and the repeated description thereof will be omitted. The drawings shown below merely illustrate examples of the embodiments, and the sizes of the drawings and the scales described in the embodiments do not necessarily coincide with each other.

First Embodiment

FIG. 1 is a schematic view showing a configuration of an optical transmission equipment 1 and an optical module 2 according to a first embodiment of the present invention. The optical transmission equipment 1 includes a printed circuit board 11 and an IC 12. The optical transmission equipment 1 is, for example, a large-capacity router or a switch. The optical transmission equipment 1 has, for example, a function of a switching equipment, and is disposed in a base station or the like. A plurality of optical modules 2 are mounted in the optical transmission equipment 1. The optical transmission equipment 1 acquires data for receiving (electric signal for receiving) from the optical module 2, determines to transmit what data to where using the IC 12 or the like, generates data for transmitting (electric signal for transmitting), and transmits the data to the corresponding optical module 2 through the printed circuit board 11.

The optical module 2 is a transceiver having a function of optical transmitting and a function of optical receiving. The optical module 2 includes a printed circuit board 21, an optical receiver module 23A which converts an optical signal received through an optical fiber 3A into an electric signal, and an optical transmitter module 23B which converts an electric signal to an optical signal and transmits the optical signal to an optical fiber 3B. The printed circuit board 21 is connected to the optical receiver module 23A and the optical transmitter module 23B through flexible printed circuits 22A and 22B (FPC), respectively. An electric signal is transmitted from the optical receiver module 23A to the printed circuit board 21 through the flexible printed circuits 22A, and an electric signal is transmitted from the printed circuit board 21 to the optical transmitter module 23B through the flexible printed circuits 22B. The optical modules 2 and the optical transmission equipment 1 are connected to each other through an electrical connector 5. The optical receiver module 23A and the optical transmitter module 23B are electrically connected to the printed circuit board 21 and convert an optical/electric signal into an electric/optical signal. The printed circuit board 21 includes a control circuit (for example, an IC) to control the electric signal transmitted from the optical receiver module 23A, and a control circuit (for example, an IC) to control the electric signal transmitting to the optical transmitter module 23B.

A transmission system according to the first embodiment includes two or more of the optical transmission equipments 1, two or more of the optical modules 2, and one or more of optical fibers 3 (not shown in FIG. 1: for example, the optical fibers 3A and 3B). One or more of the optical modules 2 are connected to each optical transmission equipment 1. The optical fiber 3 is connected between the optical modules 2 mounted on the two optical transmission equipments 1, respectively. Transmitting data generated by one of the optical transmission equipment 1 is converted into an optical signal by the mounted optical module 2, and such an optical signal is transmitted to the optical fiber 3. The optical signal transmitted over the optical fiber 3 is received by the optical module 2 mounted on the other of the optical transmission equipment 1, and the optical module 2 converts the optical signal into an electric signal and transmits the electric signal to the other of the optical transmission equipment 1 as receiving data.

The optical receiver module 23A provided in the optical module 2 includes one or a plurality of optical subassemblies. Here, each of the one or the plurality of optical subassemblies is a receiver optical subassembly (ROSA) including one or a plurality of light-receiving elements. In a case where the optical receiver module 23A includes a plurality of ROSAs, the flexible printed circuits 22A include a plurality of sub-flexible printed circuits. The optical transmitter module 23B includes one or a plurality of optical subassemblies. Here, each of the one or the plurality of optical subassemblies is a transmitter optical subassembly (TOSA) including one or a plurality of light-emitting elements. In a case where the optical transmitter module 23B includes a plurality of TOSAs, the flexible printed circuits 22B include a plurality of sub-flexible printed circuits. The optical transmitter module 23B according to the first embodiment includes one TOSA for performing a 100-Gbit/s-class optical signal transmission and the TOSA is a box-type TOSA including four light-emitting elements.

An optical module according to the present invention includes an optical subassembly including one or a plurality of optical elements, a printed circuit board including a control circuit for controlling one or a plurality of optical elements, and a connection substrate for connecting the optical subassembly and the printed circuit board. Here, the optical subassembly according to the first embodiment is a TOSA provided in the optical transmitter module 23B, and the control circuit (for example, IC) provided in the printed circuit board controls the one or the plurality of light-emitting elements provided in the TOSA. The connection substrates according to first embodiment are the flexible printed circuits.

Figure 2:
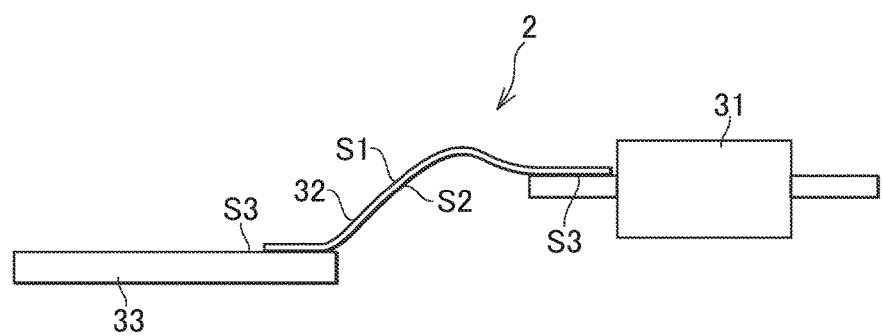
FIG. 2 is a diagram showing a structure of a main part of the optical module according to the first embodiment of the present invention.

FIG. 2 is a diagram showing a structure of the main part of the optical module 2 according to the first embodiment. The module 2 shown in the figure includes an optical subassembly 31, flexible printed circuits 32, and a printed circuit board 33, the optical subassembly 31 is a box type TOSA provided in the optical transmitter module 23B, the flexible printed circuits 32 are a flexible printed circuits 22B shown in FIG. 1, and the printed circuit board 33 is the printed circuit board 21 shown in FIG. 1.

The flexible printed circuits 32 have a first surface S1 and a second surface S2. The second surface S2 of the flexible printed circuits 32 faces (or, is opposed to) the front surface (third surface S3) of the printed circuit board 33 and is physically contacted and connected thereto. Similarly, the second surface S2 of the flexible printed circuits 32 faces (or is opposed to) the front surface (third surface S3) (of the connection portion) of the optical subassembly 31 and is physical contacted and connected thereto.

Figure 3:
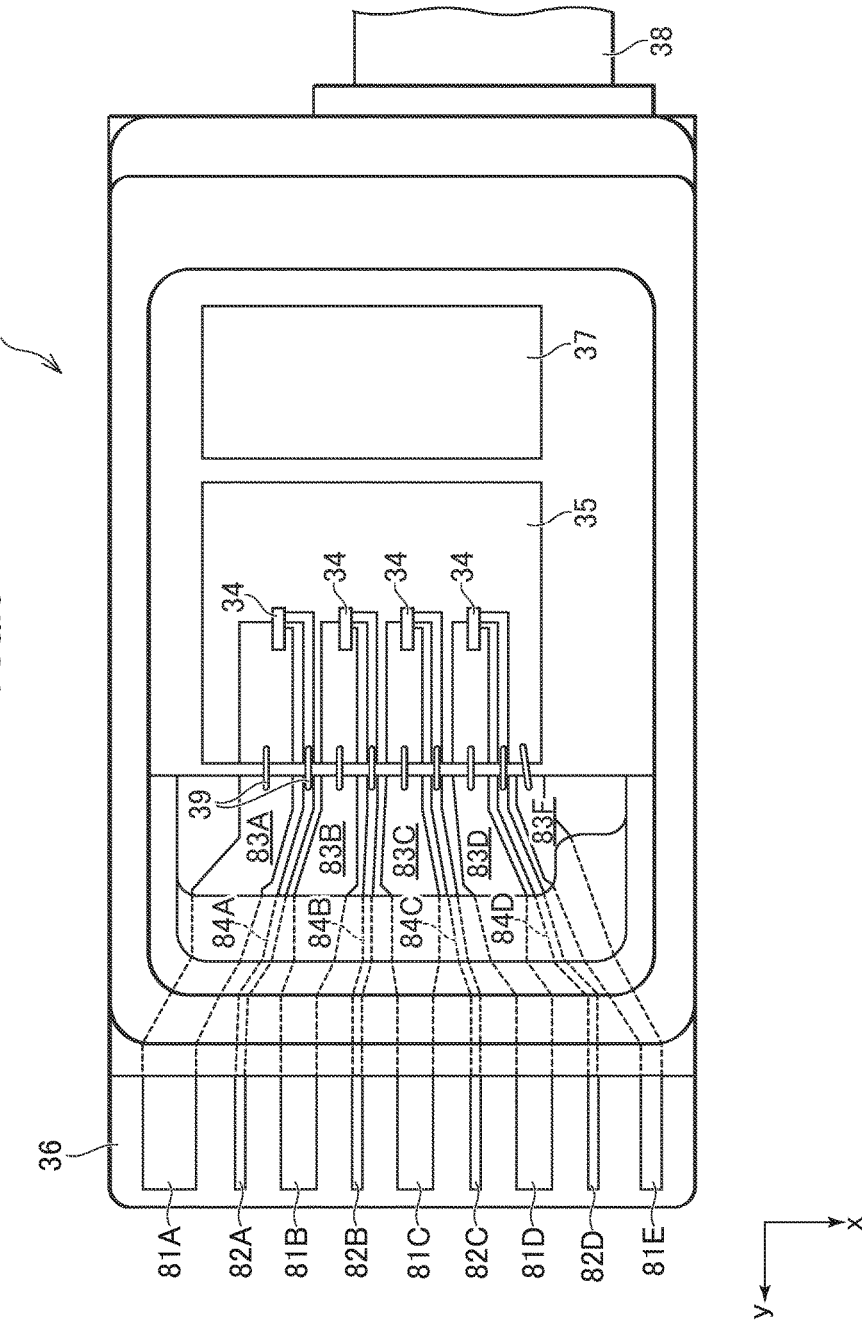
FIG. 3 is a schematic view showing a structure of an optical subassembly according to a first embodiment of the present invention.

FIG. 3 is a schematic view showing a structure of the optical subassembly 31 according to the first embodiment. As described above, the optical subassembly 31 is a box type TOSA including four (4ch) light-emitting elements. FIG. 3 is a plan view of the optical subassembly 31, but a lid portion of a casing is omitted in order to explain an internal structure thereof. For ease of explanation, the x-axis and the y-axis are shown in FIG. 3. The optical subassembly 31 has four light-emitting elements 34 (laser diodes (LDs)), a sub-mount 35 on which the four light-emitting elements 34 are mounted, a feedthrough 36, an optical component 37, and a sleeve 38. A metal pattern is formed on the front surface of the sub-mount 35 and is electrically connected to the four light-emitting elements 34. The sub-mount 35 and the feedthrough 36 are connected by connection wires 39. The optical component 37 parallelizes and multiplexes the optical signals emitted from the four light-emitting elements 34 and makes the optical signals incident on the sleeve 38. The light-emitting element 34 may be a direct modulation distributed feedback (DFB) laser, an electro-absorption (EA) modulator integrated DFB laser, another laser element or the like. The feedthrough 36 includes a plurality of pad portions (terminals) described later.

Figure 4:
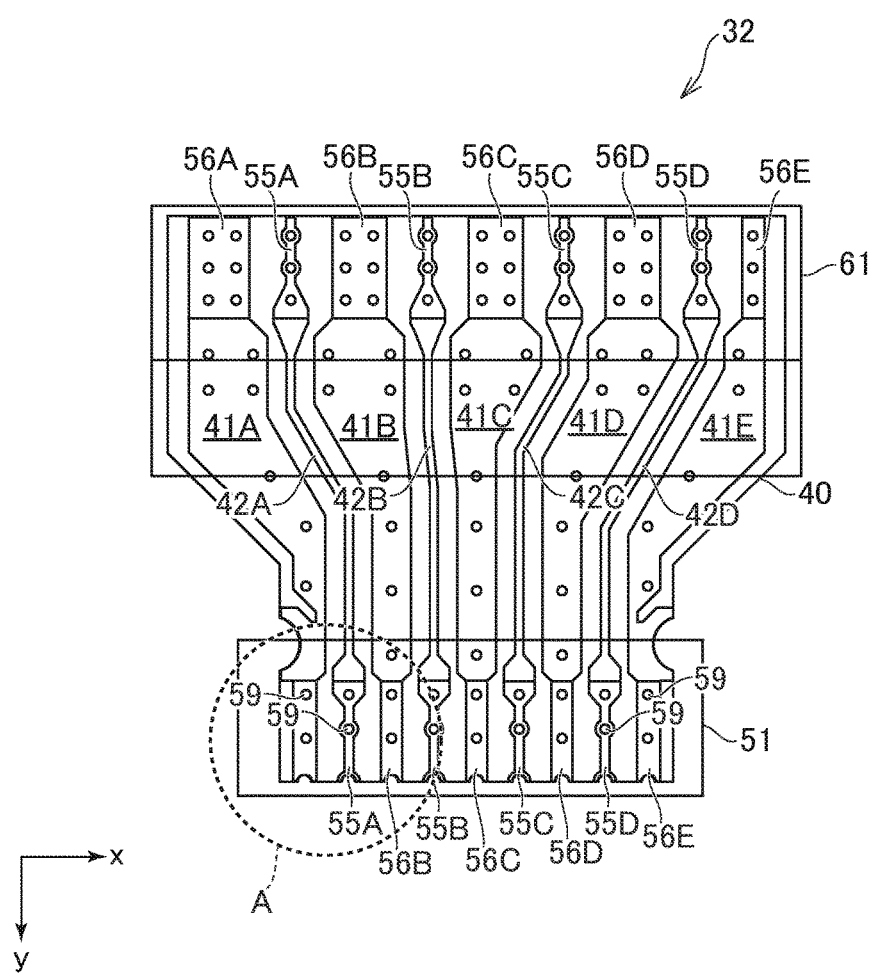
FIG. 4 is a schematic view showing a structure of flexible printed circuits according to the first embodiment of the present invention.

FIG. 4 is a schematic view showing a structure of the flexible printed circuits 32 according to the first embodiment. As described above, four (4 ch) coplanar lines are formed on the flexible printed circuits 32. The flexible printed circuits 32 include a flexible dielectric layer 40 as a base. For ease of explanation, the x-axis and the y-axis are shown in FIG. 4 corresponding to the x-axis and the y-axis shown in FIG. 3. As shown in FIG. 4, on the front surfaces of (dielectric layer 40 of) the flexible printed circuits 32 according to the first embodiment, a ground conductor film 41A, a signal line conductor strip 42A, a ground conductor film 41B, a signal line conductor strip 42B, a ground conductor film 41C, a signal line conductor strip 42C, a ground conductor film 41D, a signal line conductor strip 42D, and a ground conductor film 41E, are disposed in this order along the +x-axis direction (first direction). Here, the front surfaces of the flexible printed circuits 32 are the first surfaces S1. A ground conductor layer 43 (not shown) is disposed on the back surfaces of (dielectric layer 40 of) the flexible printed circuits 32 according to the first embodiment. Here, the back surfaces of the flexible printed circuits 32 are the second surfaces S2. Four (4 ch) coplanar lines are assumed to be a first coplanar line, a second coplanar line, a third coplanar line, and a fourth coplanar line arranged in this order in the +x-axis direction. The first coplanar line is configured to include the signal line conductor strip 42A, the ground conductor films 41A and 41B disposed on both sides of the signal line conductor strip 42A, the ground conductor layer 43 (not shown), and a dielectric layer 40. The ground conductor layer 43 is formed so as to overlap the signal line conductor strips 42A (and 42B, 42C, and 42D) and further spread outward on both sides. That is, such a coplanar line is a so-called coplanar line with a ground (ground conductor layer). The second coplanar line is configured to include the signal line conductor strip 42B, the ground conductor films 41B and 41C, the ground conductor layer 43, and the dielectric layer 40. The same applies to the third coplanar line and the fourth coplanar line.

As shown in FIG. 4, the flexible printed circuits 32 according to the first embodiment include a first connection portion 51 connected to the printed circuit board 33 on the second surface S2 and a second connection portion 61 connected to the optical subassembly 31 on the second surface S2. The first connection portion 51 includes front surface signal line pad portions 55A, 55B, 55C, and 55D disposed on the front surface, front surface ground pad portions 56A, 56B, 56C, 56D, and 56E disposed on the front surface, back surface signal line pad portions 57A, 57B, 57C, and 57D (not shown) disposed on the back surface, and back surface ground pad portions 58A, 58B, 58C, 58D and 58E (not shown) disposed on the back surface. The front surface signal line pad portions 55A, 55B, 55C, and 55D are electrically connected to the back surface signal line pad portions 57A, 57B, 57C, and 57D, respectively, by soldering through a plurality of through-holes 59. Similarly, the front surface ground pad portions 56A, 56B, 56C, 56D, and 56E are electrically connected to the back surface ground pad portions 58A, 58B, 58C, 58D, and 58E, respectively, by soldering through the plurality of through-holes 59. The plurality of through-holes 59 may have a structure in which a conductor is disposed in the hole and each pad portion on the front surface side and the pad portion on the back surface side are electrically connected without soldering. A structure in which the pad portion on the front surface side and the pad portion on the back surface side are electrically connected may be adopted.

On the front surfaces of (dielectric layer 40 of) the flexible printed circuits 32 according to the first embodiment, the front surface signal line pad portion and the front surface ground pad portion are disposed repeatedly to be aligned in this order. That is, on the front surfaces of the flexible printed circuits 32, the front surface ground pad portion 56A, the front surface signal line pad portion 55A, the front surface ground pad portion 56B, the front surface signal line pad portion 55B, a front surface ground pad portion 56C, a front surface signal line pad portion 55C, a front surface ground pad portion 56D, a front surface signal line pad portion 55D, and a front surface ground pad portion 56E are arranged in this order along the +x-axis direction (first direction). That is, the portions are arranged on a GSGSGSGSG sequence. The front surface signal line pad portions 55A, 55B, 55C, and 55D are physically in contact with the signal line conductor strips 42A, 42B, 42C, and 42D, respectively. The line widths of the signal line conductor strips 42A, 42B, 42C, and 42D are determined according to characteristic impedance (50Ω) of the coplanar line, but are small (narrow) compared with the line widths of the back surface signal line pad portions 57A, 57B, 57C, and 57D. Accordingly, the signal line conductor strips 42A, 42B, 42C, and 42D extend in the second direction (+y-axis direction), but the line widths of the signal line conductor strips 42A, 42B, 42C, and 42D gradually increase (widen) on the connection points with the front surface signal line pad portions 55A, 55B, 55C, and 55D, and reach the front surface signal line pad portions 55A, 55B, 55C, and 55D.

The front surface ground pad portions 56A, 56B, 56C, 56D, and 56E are physically in contact with the ground conductor films 41A, 41B, 41C, 41D, and 41E, respectively. The ground conductor films 41A, 41B, 41C, 41D, and 41E maintain a constant distance from adjacent signal line conductor strips 42A, 42B, 42C, and 42D, and the shapes of the ground conductor films 41A, 41B, 41C, 41D, and 41E are determined by the adjacent signal line conductor strips 42A, 42B, 42C, and 42D. On the back surfaces of (dielectric layer 40 of) the flexible printed circuits 32 according to the first embodiment, the back surface signal line pad portion and the back surface ground pad portion are disposed repeatedly to be aligned in this order. That is, on the back surfaces of the flexible printed circuits 32, the back surface ground pad portion 58A, the back surface signal line pad portion 57A, the back surface ground pad portion 58B, the back surface signal line pad portion 57B, a back surface ground pad portion 58C, a back surface signal line pad portion 57C, a back surface ground pad portion 58D, a back surface signal line pad portion 57D, and a back surface ground pad portion 58E are disposed in this order along the +x-axis direction (first direction). The ground conductor layer 43 is physically in contact with each of the back surface ground pad portions 58A, 58B, 58C, 58D, and 58E. The flexible printed circuits 32 have a gap portion G between the ground conductor layer 43 and each of the back surface signal line pad portions 57A, 57B, 57C, and 57D (see FIG. 6B described later). Due to the gap portion G, the back surface signal line pad portions 57A, 57B, 57C, and 57D are physically isolated from the ground conductor layer 43.

The width (width each of the end portions of the flexible printed circuits 32 on the printed circuit board 33 side) of the first connection portion 51 connected to the printed circuit board 33 are narrow compared with the width (width each of the end portions of the flexible printed circuits 32 on the optical subassembly 31 side) of the second connection portion 61 connected to the optical subassembly 31. Accordingly, the four signal line conductor strips 42A, 42B, 42C, and 42D aligned on the front surfaces of the flexible printed circuits 32 extend in the +y-axis direction from the second connection portion 61, but bend inward and extend on the way, further bend in the +y-axis direction, extend in the +y-axis direction, and reach the first connection portion 51. A coverlay is disposed on the front surfaces of the flexible printed circuits 32 except for the first connection portion 51 and the second connection portion 61, but is not shown in FIG. 4. Similarly, a coverlay is also disposed on the back surfaces of the flexible printed circuits 32 except for the first connection portion 51 and the second connection portion 61. The coverlay is disposed to provide electrical isolation from the external environment.

Figure 5:
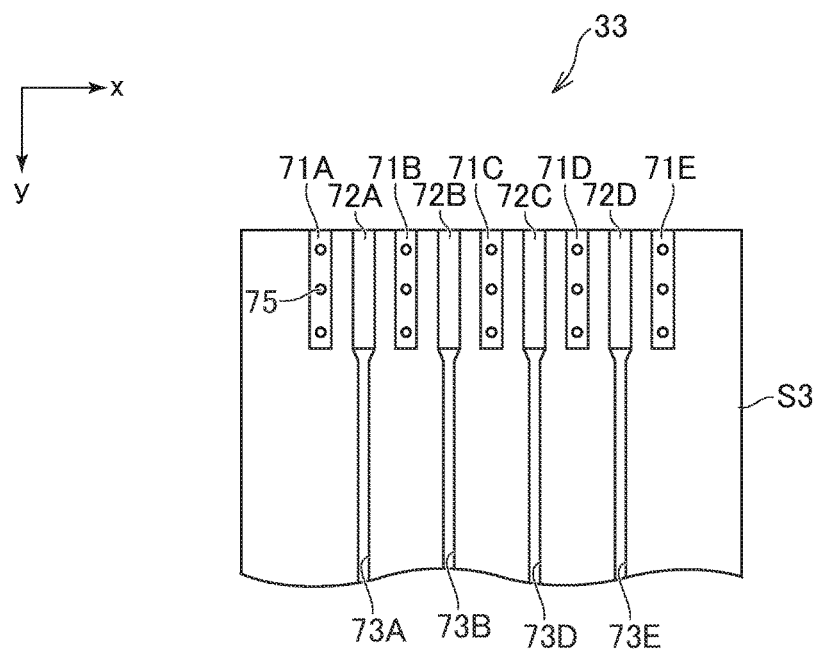
FIG. 5 is a schematic view showing a structure of a printed circuit board according to the first embodiment of the present invention.

FIG. 5 is a schematic view showing a structure of the printed circuit board 33 according to first the embodiment. For ease of explanation, the x-axis and the y-axis are shown in FIG. 5 corresponding to the x-axis and the y-axis shown in FIG. 4. On the front surface (third surface S3) of the printed circuit board 33, a PCB ground pad portion 71A (third ground pad portion), a PCB signal line pad portion 72A (third signal line pad portion), a PCB ground pad portion 71B, a PCB signal line pad portion 72B, a PCB ground pad portion 71C, a PCB signal line pad portion 72C, a PCB ground pad portion 71D, a PCB signal line pad portion 72D, and a PCB ground pad portion 71E are disposed in this order along the +x-axis direction (first direction). The printed circuit board 33 is a printed wiring board of a multilayer structure in which a plurality of conductor layers are formed via dielectric layers, respectively. Among the plurality of conductor layers, the conductor layer formed on the front surface of the printed circuit board 33 is set as a first metal layer, and a second metal layer, a third metal layer, . . . and so on are formed in this order along a lamination direction. Four PCB signal line conductor strips 73A, 73B, 73C, and 73D are disposed on the first metal layer of the printed circuit board 33. The PCB signal line conductor strips 73A, 73B, 73C, and 73D are physically in contact with the PCB signal line pad portions 72A, 72B, 72C, and 72D, respectively. A PCB ground conductor layer (not shown) is disposed in a second metal layer, and the PCB ground pad portions 71A, 71B, 71C, 71D, and 71E are electrically connected to the PCB ground conductor layer through via holes 75. Four (4ch) microstrip lines are formed on the printed circuit board 33. For example, one microstrip line is constituted with the PCB signal line conductor strip 73A, the PCB ground conductor layer, and the dielectric layer. The same applies to the PCB signal line conductor strips 73B, 73C, and 73D.

The line widths of the PCB signal line conductor strips 73A, 73B, 73C, and 73D are determined according to characteristic impedance (50Ω) of the microstrip line, but are small (narrow) compared with the line widths of the PCB signal line pad portions 72A, 72B, 72C, and 72D. The PCB signal line conductor strips 73A, 73B, 73C, and 73D extend from the PCB signal line pad portions 72A, 72B, 72C, and 72D in the second direction (+y-axis direction), but are gradually smaller (narrower) than the line widths of the PCB signal line pad portions 72A, 72B, 72C, and 72D on the connection points with the PCB signal line pad portions 72A, 72B, 72C, and 72D. Each of the PCB signal line pad portions 72A, 72B, 72C, and 72D and each of the PCB ground pad portions 71A, 71B, 71C, 71D, and 71E have a rectangular shape extending in the second direction (+y axis direction) from the end of the printed circuit board 33.

Figure 6A:
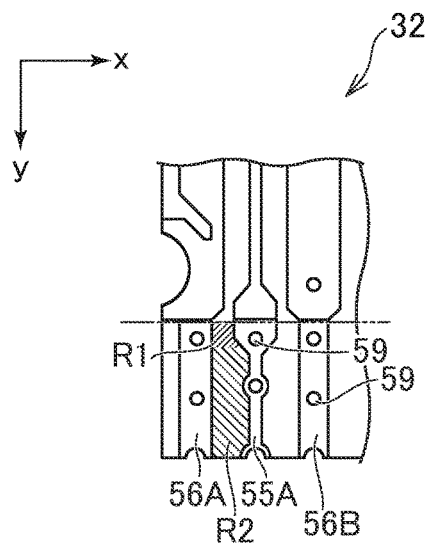
FIG. 6A is a plan view of a portion of the flexible printed circuits according to the first embodiment of the present invention.
Figure 6B:
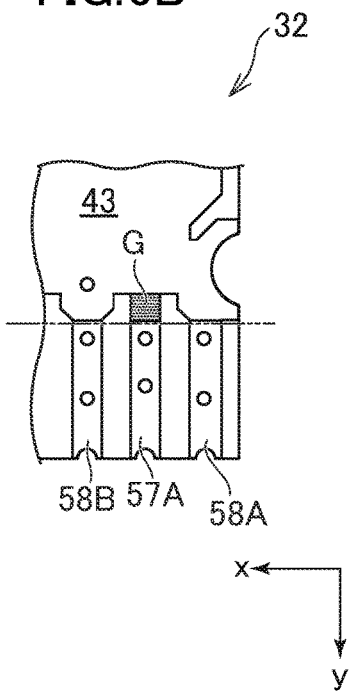
FIG. 6B is a bottom view of the portion of the flexible printed circuits according to the first embodiment of the present invention.

FIG. 6A is a plan view of a portion of the flexible printed circuits 32 according to the first embodiment, and FIG. 6B is a bottom view of the portion of the flexible printed circuits 32 according to the first embodiment. That is, FIG. 6A shows the front surfaces (first surfaces S1) of the flexible printed circuits 32 and FIG. 6B shows the back surfaces (second surfaces S2) of the flexible printed circuits 32. Both FIG. 6A and FIG. 6B are enlargements of a region A shown in FIG. 4, and the x-axis and the y-axis are shown in FIGS. 6A and 6B by being corresponded to the x-axis and the y-axis shown in FIG. 4.

The main feature of the present invention resides in a structure of the connection portions of the flexible printed circuits 32 with the optical subassembly 31 and/or the printed circuit board 33. In the first embodiment, along the first direction (+x-axis direction), the distances between the front surface signal line pad portions 55A, 55B, 55C, and 55D and the front surface ground pad portions 56A, 56B, 56C, 56D, and 56E which are disposed adjacent to each of both sides thereof are respectively different from the distances between the back surface signal line pad portions 57A, 57B, 57C, and 57D and the back surface ground pad portions 58A, 58B, 58C, 58D, and 58E disposed adjacent to each of both sides thereof.

Hereinafter, the first connection portion 51 connected to the printed circuit board 33 will be described. The shapes of the back surface signal line pad portions 57A, 57B, 57C, and 57D of the first connection portion 51 correspond to the shapes of the PCB signal line pad portions 72A, 72B, 72C, and 72D, respectively, and the shapes of the back surface signal line pad portions 57A, 57B, 57C, and 57D of the first connection portion 51 are connected in contact with the PCB signal line pad portions 72A, 72B, 72C, and 72D, respectively, so as to oppose and overlap (substantially coincide with) each other. In a state in which the back surface signal line pad portions 57A, 57B, 57C, and 57D of the first connection portion 51 and the PCB signal line pad portions 72A, 72B, 72C, and 72D are in contact with each other so as to overlap (substantially coincide with) each other, solder is injected into the through-holes 59 of the front surface signal line pad portions 55A, 55B, 55C, and 55D and soldered so that the back surface signal line pad portions 57A, 57B, 57C, and 57D of the first connection portion 51 and the PCB signal line pad portions 72A, 72B, 72C, and 72D, are physically and also electrically connected to each other. The shapes of the back surface signal line pad portions 57A, 57B, 57C, and 57D substantially coincide with the shapes of the PCB signal line pad portions 72A, 72B, 72C, and 72D, and are rectangular. The shapes of the PCB signal line pad portions 72A, 72B, 72C, and 72D may be made larger than the shapes of the back surface signal line pad portions 57A, 57B, 57C, and 57D to the same extent as manufacturing errors in consideration of manufacturing errors.

Similarly, the back surface signal line pad portions 58A, 58B, 58C, 58D, and 58E of the first connection portion 51 are connected in contact with the PCB ground pad portions 71A, 71B, 71C, 71D, and 71E, respectively, so as to oppose and overlap each other. Similar to the back surface signal line pad portions 57A, 57B, 57C, and 57D, the shapes of the back surface ground pad portions 58A, 58B, 58C, 58D, and 58E substantially coincide with those of the PCB ground pad portions 71A, 71B, 71C, 71D, and 71E, and are rectangular.

Here, as shown in FIGS. 6A and 6B, the back surface ground pad portion 58A is disposed adjacent to the back surface signal line pad portion 57A, and the front surface ground pad portion 56A is disposed adjacent to the front surface signal line pad portion 55A so as to overlap each other in plan view. The shape of the front surface ground pad portion 56A is rectangular extending in the second direction (+y-axis direction) and substantially coincides with the shape of the back surface ground pad portion 58A. That is, in plan view, the front surface ground pad portion 56A is disposed so as to overlap (substantially coincide with) the back surface ground pad portion 58A. In contrast, in plan view, the front surface signal line pad portion 55A is disposed so as to overlap the back surface signal line pad portion 57A, but the shape of the front surface signal line pad portion 55A is different from the shape of the back surface signal line pad portion 57A.

The front surface signal line pad portions 55A, 55B, 55C, and 55D are physically in contact with the signal line conductor strips 42A, 42B, 42C, and 42D, respectively, but the inner end portions of the front surface signal line pad portions 55A, 55B, 55C, and 55D on the gap portion G side are defined by the position (coordinates) along the y-axis direction of inner end portions (boundaries with the gap portion G) of the back surface signal line pad portions 57A, 57B, 57C, and 57D. That is, the inner end portions of the front surface signal line pad portions 55A, 55B, 55C, and 55D on the gap portion G side are defined by a straight line in the x-axis direction penetrating the inner end portions of the back surface signal line pad portions 57A, 57B, 57C, and 57D. Similarly, the front surface ground pad portions 56A, 56B, 56C, 56D, and 56E are physically in contact with the ground conductor films 41A, 41B, 41C, 41D, 41E, respectively, but the inner end portions of the front surface ground pad portions 56A, 56B, 56C, 56D and 56E are defined by positions (coordinates) along the y-axis direction of inner end portions (boundaries with the gap portion G) of the back surface signal line pad portions 57A, 57B, 57C and 57D. The back surface ground pad portions 58A, 58B, 58C, 58D, and 58E are physically in contact with the ground conductor layer 43, respectively, but the inner end portions of the back surface ground pad portions 58A, 58B, 58C, 58D, and 58E are defined by positions (coordinates) along the y-axis direction of inner end portions (boundaries with the gap portion G) of the back surface signal line pad portions 57A, 57B, 57C and 57D.

Consider a region between the front surface signal line pad portion 55A and the front surface ground pad portion 56A which are disposed adjacent to each other. Among these regions, a region close to the inner end portion on the gap portion G side is defined as a first region R1, and a region farther from the inner end portion on the gap portion G side is set as a second region R2. In the first region R1, in plan view, the edge of the front surface signal line pad portion 55A on the front surface ground pad portion 56A side is located outside the edge of the back surface signal line pad portion 57A on the back surface ground pad portion 58A side (front ground pad Portion 56A side). In contrast, in the second region R2, in plan view, the edge of the front surface signal line pad portion 55A on the front surface ground pad portion 56A side is located inside the edge of the back surface signal line pad portion 57A on the back surface ground pad portion 58A side (side opposite to the front surface ground pad portion 56A side). That is, the width of the portion of the front surface signal line pad portion 55A adjacent to the first region R1 is wider than the width of the corresponding portion of the back surface signal line pad portion 57A in plan view. The width of the portion of the front surface signal line pad portion 55A adjacent to the second region R2 is narrower than the width of the corresponding portion of the back surface signal line pad portion 57A in plan view. The width of the pad portion referred to here means a length in the x-axis direction from the edge on one side to the edge on the other side. The edge of the front surface ground pad portion 56A on the front surface signal line pad portion 55A side is a straight line along the second direction (+y-axis direction). Thus, the distance between the front surface signal line pad portion 55A and the front surface ground pad portion 56A is narrower than that of the second region R2 in the first region R1. The distance between the front surface signal line pad portion 55A and the front surface ground pad portion 56A is the length in the x-axis direction from the edge of the front surface ground pad portion 56A on the front surface signal line pad portion 55A side to the edge of the front surface ground pad portion 56A on the front surface signal line pad portion 55A side.

Figure 7:
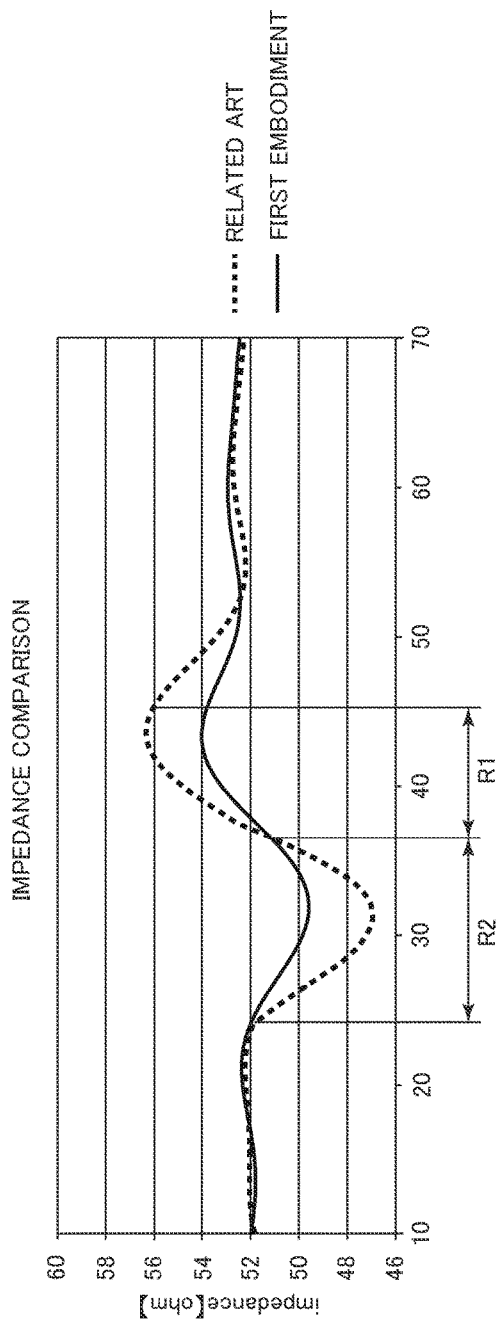
FIG. 7 is a diagram showing impedance characteristics of the flexible printed circuits according to the first embodiment of the present invention.

FIG. 7 is a diagram showing impedance characteristics in a state in which the flexible printed circuits 32 and the printed circuit board 33 according to the first embodiment are connected. In FIG. 7, impedance characteristics in the vicinity of the first connection portion 51 of each of the flexible printed circuits 32 are indicated by a solid line, and impedance characteristics of connection portions of the flexible printed circuits according to the related art are indicated by a broken line. The horizontal axis in FIG. 7 represents a position (coordinates: mm) along the y-axis direction extending including the center line of the front surface signal line pad portion 55A in plan view, and the vertical axis in FIG. 7 represents characteristic impedance (a). Here, instead of the front surface signal line pad portion 55A and the front surface ground pad portion 56A according to the embodiment, the flexible printed circuits according to the related art include a front surface signal line pad portion and a front surface ground pad portion which are respectively coincident with the shapes of the back surface signal line pad portion 57A and the back surface ground pad portion 58A in plan view. That is, the distance between the front surface signal line pad portion and the front surface ground pad portion is constant along the second direction (+y-axis direction).

In the flexible printed circuits according to the related art, characteristic impedance increases due to the gap portion located between the ground conductor layer and the back surface signal line pad portion in the vicinity of the inner end portion of the front surface signal line pad portion on the gap portion side. Characteristic impedance decreases due to a large overlapping area of the front surface signal line pad portion and the back surface signal line pad portion in the vicinity of the outer end portion (end portion on the opposite side to the gap portion side) of the front surface signal line pad portion.

In contrast, in the flexible printed circuits 32 according to the first embodiment, since the distance between the front surface signal line pad portion 55A and the front surface ground pad portion 56A is reduced in the first region R1, the capacitance component is increased, and the characteristic impedance can be decreased to approach 50 Ω as compared with the related art. In the second region R2, since the distance between the front surface signal line pad portion 55A and the front surface ground pad portion 56A is increased, the capacitance component is decreased, and the characteristic impedance can be increased to approach 50 Ω as compared with the related art.

Compared to the related art, if there is a first region R1 where the distance between the front surface signal line pad portion 55A and the front surface ground pad portion 56A is smaller than the distance in the second region R2 on the inner end portion side of the front surface signal line pad portion 55A, it is possible to suppress impedance increase on the inner end portion side. In particular, in at least a portion (first region R1) on the inner end portion side, the distance between the front surface signal line pad portion 55A and the front surface ground pad portion 56A is preferably smaller than the distance between the back surface signal line pad portion 57A and the back surface ground pad portion 58A. Compared to the related art, if there is the second region R2 where the distance between the front surface signal line pad portion 55A and the front surface ground pad portion 56A is larger on the outer end portion side of the front surface signal line pad portion 55A, it is possible to suppress impedance increase on the outer end portion side. In particular, in at least a portion of the outer end surface side (second region R2), the distance between the front surface signal line pad portion 55A and the front surface ground pad portion 56A is preferably larger than the distance between the back surface signal line pad portion 57A and the back surface ground pad portion 58A.

From the viewpoint of impedance matching, if the distance between the front surface signal line pad portion 55A and the front surface ground pad portion 56A is small in a portion of the region of the inner end portion side so as to suppress impedance increase on the inner end portion side, as compared with the related art, the effect of impedance matching is achieved. If the distance between the front surface signal line pad portion 55A and the front surface ground pad portion 56A is large in a portion of the region of the outer end portion side so as to suppress impedance decrease on the outer end portion side, as compared with the related art, the effect of impedance matching is achieved. In order to enhance the effect of impedance matching, it is more preferable that the region from the inner end portion to the outer end portion is constituted only by the first region R1 and the second region R2. That is, it is preferable that the first region R1 extends to the inner end portion on the side of the gap portion G. It is preferable that the second region R2 extends to the outer end portion. The first region R1 and the second region R2 are preferably in contact with each other.

As described above, the front surface signal line pad portion 55A is electrically connected to the back surface signal line pad portion 57A via one or a plurality of through-holes 59. A portion of the front surface signal line pad portions 55A on the side of the outer end portion is formed to have a narrower width, but the through-holes 59 are also formed in the portion. In consideration of formation of the through-hole 59 and a manufacturing error of the through-hole, the width is widened in a region where the through-hole 59 is formed among such portions. In the first embodiment, even in the region where the through-hole 59 is formed, the width of the front surface signal line pad portion 55A is narrower than the width of the back surface signal line pad portion 57A, and is included in the second region R2. However, the width of the front surface signal line pad portion 55A may be wider than the width of the back surface signal line pad portion 57A in such a region depending on circumstances such as a manufacturing error of the through-hole. That is, such a region need not be included in the second region R2.

In the first embodiment, impedance mismatching can be suppressed by deforming the shapes of the front surface signal line pad portions 55A, 55B, 55C, and 55D provided in the first connection portion 51. That is, as compared with the related art, new parts and space are not required to realize the performance of suppressing impedance mismatching, there is no need to increase the sizes of the flexible printed circuits 32 in order to perform impedance matching, and miniaturization and high-density mounting of the optical module 2 are realized together. Then, the back surface signal line pad portions 57A, 57B, 57C, and 57D and the back surface ground pad portions 58A, 58B, 58C, 58D, and 58E on the side connected to the printed circuit board 33 are realized together with securing a sufficient size to obtain sufficient bonding strength and improving impedance characteristics.

Second Embodiment

Figure 8:
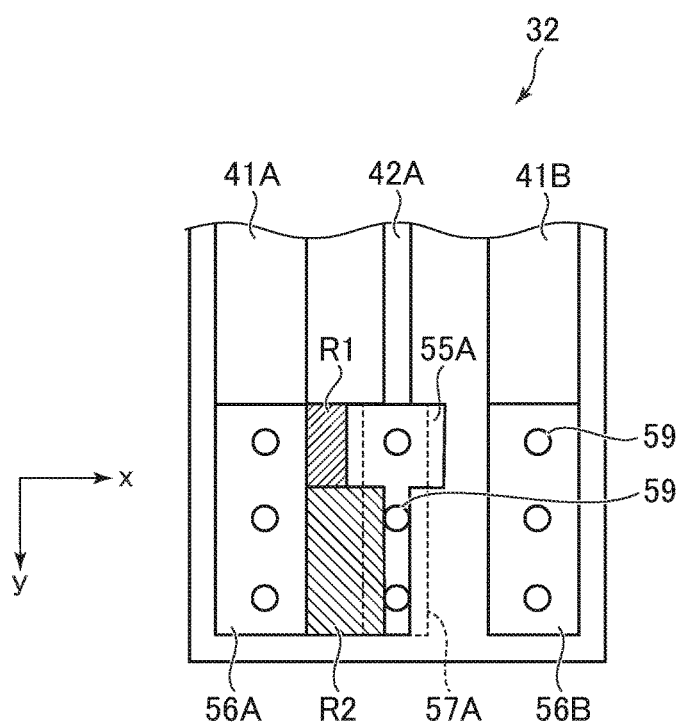
FIG. 8 is a schematic view showing a structure of first connection portions of flexible printed circuits according to a second embodiment of the present invention.
Figure 9:
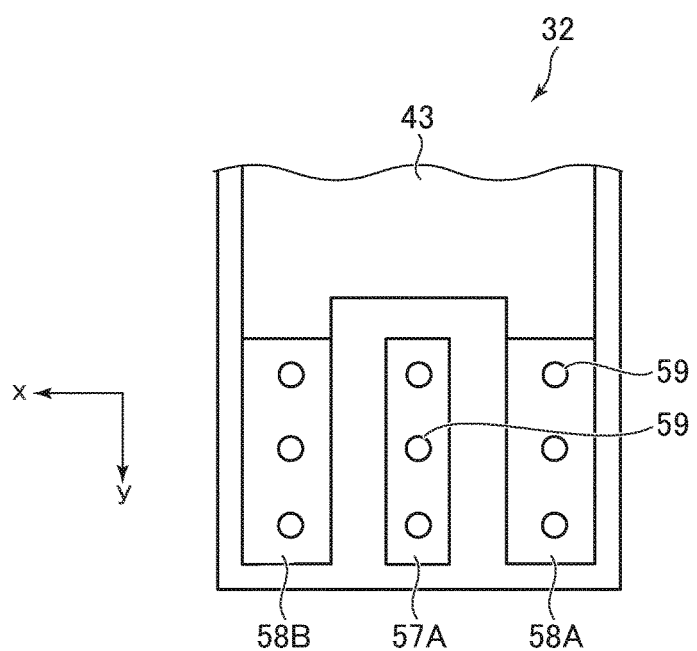
FIG. 9 is another schematic view showing the structure of the first connection portions of the flexible printed circuits according to the second embodiment of the present invention.
Figure 10:
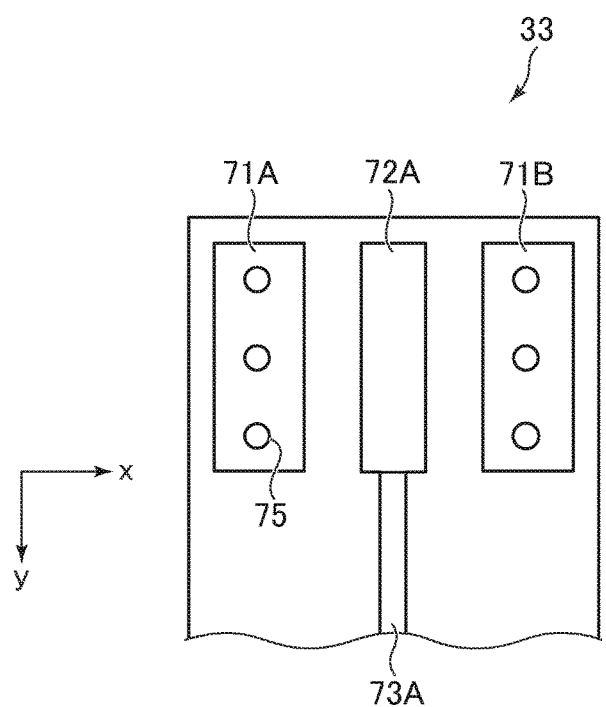
FIG. 10 is a schematic view showing a structure of a printed circuit board according to the second embodiment of the present invention.

FIGS. 8 and 9 are schematic views showing the structure of the first connection portion 51 of each of the flexible printed circuits 32 according to a second embodiment of the present invention. FIG. 10 is a schematic view showing the structure of the printed circuit board 33 according to the second embodiment. FIG. 8 is a view (plan view) showing the front surfaces of the flexible printed circuits 32, and FIG. 9 is a view (bottom view) showing the back surfaces of the flexible printed circuits 32. Unlike the first embodiment, one (1 ch) coplanar line is formed on each of the flexible printed circuits 32 according to the second embodiment. For easy understanding of the present invention, unlike the first connection portion 51 shown in FIGS. 6A and 6B, the flexible printed circuits 32 are schematically shown in FIG. 8 and FIG. 9. The same applies to FIG. 10. In FIGS. 8 to 10, the x-axis and the y-axis are shown. The same applies to the figures described in the following.

In the flexible printed circuits 32 according to the second embodiment, similarly as in the first embodiment, in the first region R1, in plan view, the edge of the front surface signal line pad portion 55A (edge on front surface ground pad portion 56B) on the front surface ground pad portion 56A side is located on the outer side (front surface ground pad portion 56A or 56B side) than the edge (edge on the back surface ground pad portion 58B side) of the back surface signal line pad portion 57A on the back surface ground pad portion 58A side. In contrast, in the second region R2, in plan view, the edge (edge of the front surface ground pad portion 56B) of the front surface signal line pad portion 55A on the front surface ground pad portion 56B side is located on the inner side (side opposite to the front surface ground pad portion 56A or 56B side) than the edge (edge on the back surface ground pad portion 58B side) of the back surface signal line pad portion 57A on the ground pad portion 58A side.

In the second embodiment, one coplanar line is formed on each of the flexible printed circuits 32, but it is possible to suppress impedance mismatching at a connection point with the printed circuit board 33 similarly as in the first embodiment.

Third Embodiment

Figure 11:
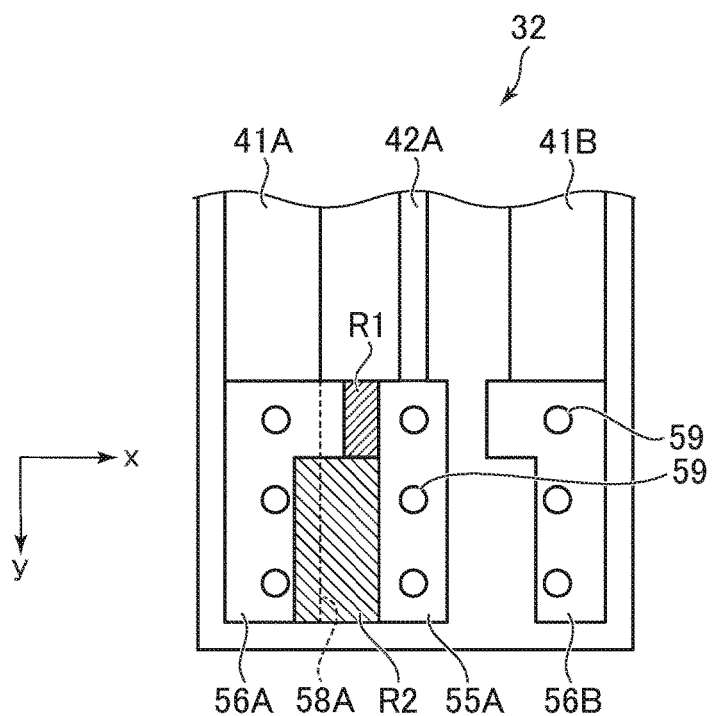
FIG. 11 is a schematic view showing a structure of first connection portions of flexible printed circuits according to a third embodiment of the present invention.

FIG. 11 is a schematic view showing a structure of the first connection portion 51 of each of the flexible printed circuits 32 according to a third embodiment of the present invention. FIG. 11 is a view (plan view) showing the front surfaces of the flexible printed circuits 32, and the back surfaces of the flexible printed circuits 32 and the front surface of the printed circuit board 33 are shown in FIGS. 9 and 10. The first connection portion 51 according to the third embodiment differs from the second embodiment in the structure of the front surface signal line pad portion 55A and the front surface ground pad portions 56A and 56B disposed on both sides of the front surface signal line pad portion 55A, but other configurations are the same.

The distance between the front surface signal line pad portion 55A and the front surface ground pad portion 56A (front surface ground pad portion 56B) is narrower than that of the second region R2 in the first region R1. However, unlike the second embodiment, the shape of the front surface signal line pad portion 55A is a rectangular shape extending in the second direction (+y-axis direction), and substantially coincides with the shape of the back surface signal line pad portion 57A. In contrast, in the first region R1, the edge of the front surface ground pad portion 56A (front surface ground pad portion 56B) on the front surface signal line pad portion 55A side in plan view is located on the outer side (front surface signal line pad portion 55A side) than the edge of the back surface ground pad portion 58A (back surface ground pad portion 58B) on the back surface signal pad portion 58A side. In the second region R2, in plan view, the edge of the front surface ground pad portion 56A (front surface ground pad portion 56B) on the front surface signal line pad portion 55A side is located on the inner side (side opposite to the front surface signal line pad portion 55A) than the edge of the back surface ground pad portion 58A (back surface ground pad portion 58B) on the back surface signal line pad portion 57A side. Also in the third embodiment, similarly as in the second embodiment, it is possible to suppress impedance mismatching at a connected point with the printed circuit board 33.

Fourth Embodiment

Figure 12:
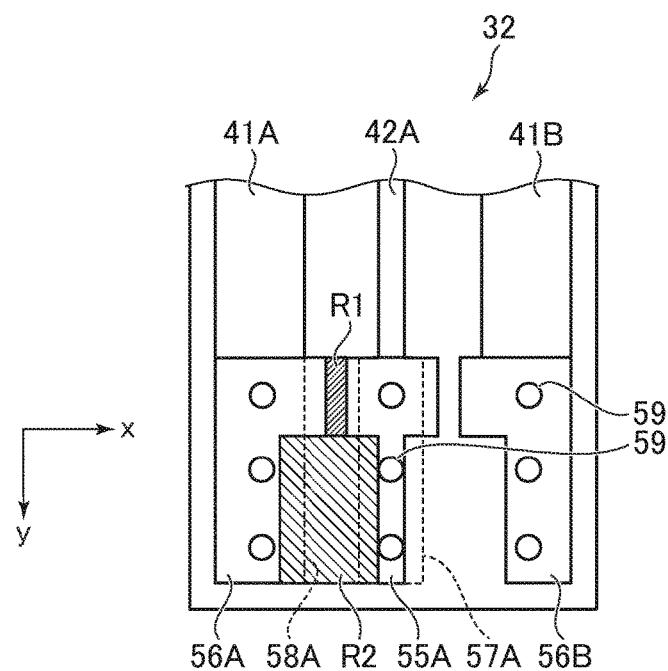
FIG. 12 is a schematic view showing a structure of first connection portions of flexible printed circuits according to a fourth embodiment of the present invention.

FIG. 12 is a schematic view showing a structure of the first connection portion 51 of each of the flexible printed circuits 32 according to a fourth embodiment of the present invention. FIG. 12 is a view (plan view) showing the front surfaces of the flexible printed circuits 32, and the back surfaces of the flexible printed circuits 32 and the front surface of the printed circuit board 33 are shown in FIGS. 9 and 10. In the first connection portion 51 according to the fourth embodiment, the structure of the front surface signal line pad portion 55A and the front surface ground pad portions 56A and 56B disposed on both sides of the front surface signal line pad portion 55A is different from those of the second and third embodiments, but the other configurations are the same.

In the first connected part 1 according to the fourth embodiment, the edge (edge on the front surface ground pad portion 56B side) of the front surface signal line pad portion 55A on the front surface ground pad portion 56A side is located outside the edge (edge on the back surface ground pad portion 58B side) of the back surface signal line pad portion 57A and the edge of the front surface ground pad portion 56A (surface ground pad portion 56B) on the front surface signal line pad portion 55A side is located outside the edge of the back surface ground pad portion 58A (back surface ground pad portion 58B) on the back surface signal line 57 side. In the second region R2, in plan view, the edge (edge on the front surface ground pad portion 56B side) of the front surface signal line pad portion 55A on the front surface ground pad portion 56A side is located inside the edge (edge on the back surface ground pad portion 58B side) of the back surface signal line pad portion 57A on the back surface ground pad portion 58A side and the edge of the front surface ground pad portion 56A (front surface ground pad portion 56B) on the front surface signal line pad portion 55A side is located inside the edge of the back surface ground pad portion 58A (back surface ground pad portion 58B) on the back surface signal line 57 side. Also, in the fourth embodiment, similarly as in the second and third embodiments, it is possible to suppress impedance mismatching at the connection point with the printed circuit board 33.

Fifth Embodiment

Figure 13:
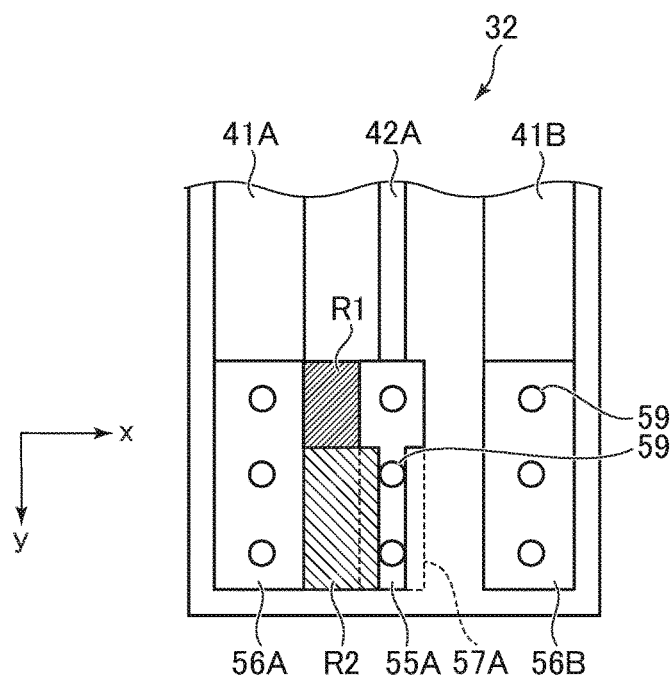
FIG. 13 is a schematic view showing a structure of first connection portions of flexible printed circuits according to a fifth embodiment of the present invention.

FIG. 13 is a schematic view showing a structure of the first connection portion 51 of each of the flexible printed circuits 32 according to a fifth embodiment of the present invention. FIG. 13 is a view (plan view) showing the front surfaces of the flexible printed circuits 32, and the back surfaces of the flexible printed circuits 32 and the front surface of the printed circuit board 33 are shown in FIGS. 9 and 10. The first connection portion 51 according to the fifth embodiment differs from the second embodiment in the structure of the front surface signal line pad portion 55A, but other configurations are the same.

In the first region R1, unlike the second embodiment, in plan view, the edge (edge of the front surface ground pad portion 56B) of the front surface signal line pad portion 55A on the front surface ground pad portion 56A side coincides with the edge (edge on the back surface ground pad portion 58B side) of the back surface signal line pad portion 57A on the back surface ground pad portion 58A side. In contrast, in the second region R2, similarly as in the second embodiment, in plan view, the edge (edge of the front surface ground pad portion 56B) of the front surface signal line pad portion 55A on the front surface ground pad portion 56A side is located inside the edge (edge on the back surface ground pad portion 58B side) of the back surface signal line pad portion 57A on the back surface ground pad portion 58A side. The flexible printed circuits 32 according to the fifth embodiment can suppress impedance reduction near the outer end portion.

Six Embodiment

Figure 14:
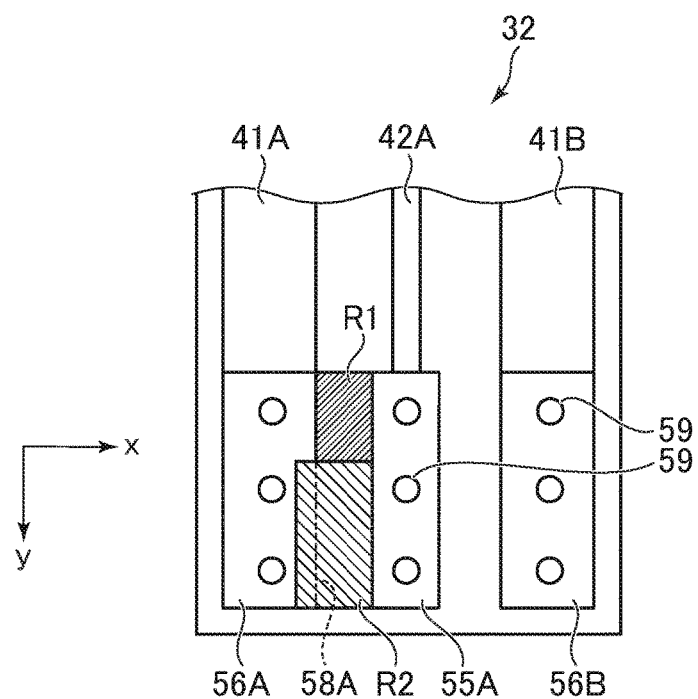
FIG. 14 is a schematic view showing a structure of first connection portions of flexible printed circuits according to a sixth embodiment of the present invention.

FIG. 14 is a schematic view showing a structure of the first connection portion 51 of each of the flexible printed circuits 32 according to a sixth embodiment of the present invention. FIG. 14 is a view (plan view) showing the front surfaces of the flexible printed circuits 32, and the back surfaces of the flexible printed circuits 32 and the front surface of the printed circuit board 33 are shown in FIGS. 9 and 10. The first connection portion 51 according to the sixth embodiment differs from the third embodiment in the structure of the front surface ground pad portions 56A and 56B disposed on both sides of the front surface signal line pad portion 55A, but other configurations are the same.

Unlike the third embodiment, in the first region R1, in plan view, the edge of the front surface ground pad portion 56A (front surface ground pad portion 56B) on the front surface signal line pad portion 55A side coincides with the edge of the back surface ground pad portion 58A (back surface ground pad portion 58B) on the back surface signal line pad portion 57A side. In contrast, in the second region R2, similarly as in the third embodiment, in plan view, the edge of the front surface ground pad portion 56A (front surface ground pad portion 56B) on the front surface signal line pad portion 55A side is located inside the edge of the back surface ground pad portion 58A (back surface ground pad portion 58B) on the back surface signal line pad portion 57A side. Similarly as in the fifth embodiment, the flexible printed circuits 32 according to the sixth embodiment can suppress impedance reduction near the outer end portion.

Seventh Embodiment

Figure 15:
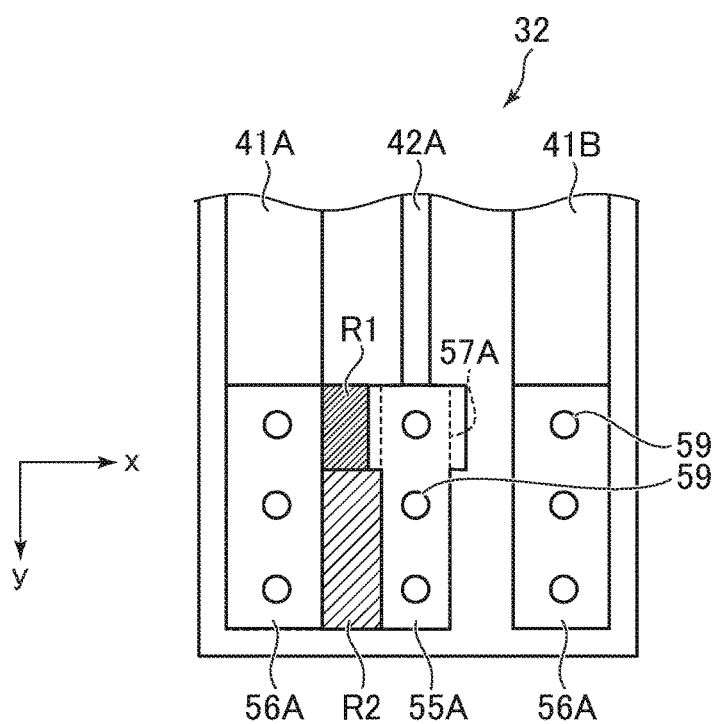
FIG. 15 is a schematic view showing a structure of first connection portions of flexible printed circuits according to a seventh embodiment of the present invention.

FIG. 15 is a schematic view showing the structure of the first connection portion 51 of each of the flexible printed circuits 32 according to a seventh embodiment of the present invention. FIG. 15 is a view (plan view) showing the front surfaces of the flexible printed circuits 32, and the back surfaces of the flexible printed circuits 32 and the front surface of the printed circuit board 33 are shown in FIGS. 9 and 10. The first connection portion 51 according to the seventh embodiment differs from the second embodiment in the structure of the front surface signal line pad portion 55A, but other configurations are the same.

In the first region R1, similarly as in the second embodiment, in plan view, the edge (edge on the front surface ground pad portion 56B side) of the front surface signal line pad portion 55A on the front surface ground pad portion 56A side is located outside the edge (edge on the back surface ground pad portion 58B side) of the back surface signal line pad portion 57A on the back surface ground pad portion 58A side. In contrast, in the second region R2, unlike the second embodiment, in plan view, the edge (edge on the front surface ground pad portion 56B side) of the front surface signal line pad portion 55A on the front surface ground pad portion 56A side coincides with the edge (edge on the back surface ground pad portion 58B side) of the back surface signal line pad portion 57A on the back surface ground pad portion 58A side. The flexible printed circuits 32 according to the seventh embodiment can suppress an impedance increase near the inner end portion.

Eighth Embodiment

Figure 16:
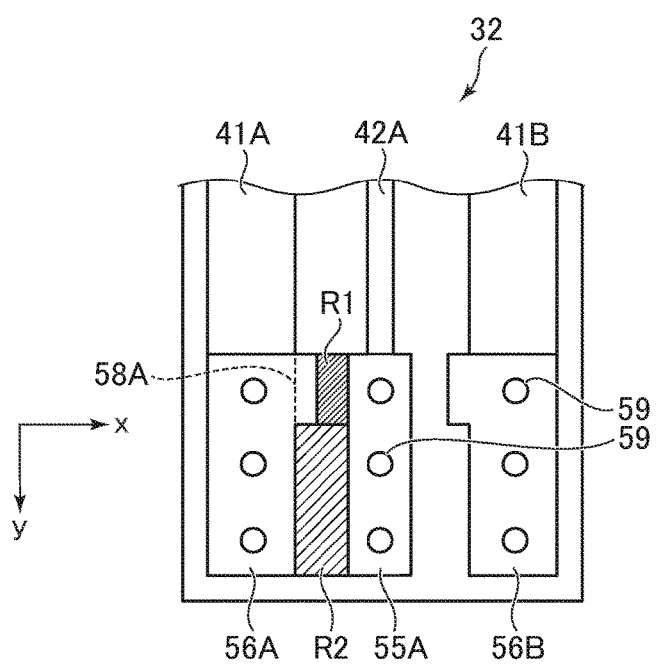
FIG. 16 is a schematic view showing a structure of first connection portions of flexible printed circuits according to an eighth embodiment of the present invention.

FIG. 16 is a schematic view showing the structure of the first connection portion 51 of each of the flexible printed circuits 32 according to an eighth embodiment of the present invention. FIG. 16 is a view (plan view) showing the front surfaces of the flexible printed circuits 32, and the back surfaces of the flexible printed circuits 32 and the front surface of the printed circuit board 33 are shown in FIGS. 9 and 10. The first connection portion 51 according to the eighth embodiment differs from the third embodiment in the structure of the front surface ground pad portions 56A and 56B disposed on both sides of the front surface signal line pad portion 55A.

In the first region R1, similarly as in the third embodiment, in plan view, the edge of the front surface ground pad portion 56A (front surface ground pad portion 56B) on the front surface signal line pad portion 55A side is located outside the edge of the back surface ground pad portion 58A (back surface ground pad portion 58B) on the back surface signal line pad portion 57A side. In contrast, in the second region R2, similarly as in the third embodiment, in plan view, the edge of the front surface ground pad portion 56A (front surface ground pad portion 56B) on the front surface signal line pad portion 55A side coincides with the edge of the back surface ground pad portion 58A (back surface ground pad portion 58B) on the back surface signal line pad portion 57A side. Similarly as in the seventh embodiment, the flexible printed circuits 32 according to the eighth embodiment can suppress the impedance increase near the inner end portion.

Ninth Embodiment

As described above, in the first to eighth embodiments, a configuration in which the front surfaces of the flexible printed circuits 32 are set as the first surfaces S1, the back surfaces are set as the second surfaces S2, and in the first connection portion 51, the back surface signal line pad portion 57A (or the like) and the back surface ground pad portions 58A and 58B (or the like) disposed on the second surface S2 are connected in contact with the front surface of the printed circuit board 33 (third surface S3), is adopted, but is not limited thereto. A configuration in which the back surfaces of the flexible printed circuits 32 are set as the first surface S1 and the front surface is set as the second surface S2 and in the first connection portion 51, the front surface signal line pad portion 55A (or the like) disposed on the second surface S2 and the front surface ground pad portions 56A and 56B (and the like) are connected in contact with the front surface of the printed circuit board 33 may be adopted.

In the first to eighth embodiments, the first signal line conductor strips disposed on one of the first surface S1 and the second surface S2 are the signal line conductor strips 42A, 42B, 42C, and 42D disposed on the first surface S1 which is a front surface and the first ground conductor layer disposed on the other of the first surface S1 and the second surface S2 is the ground conductor layer 43 disposed on the second surface S2 which is a back surface. That is, here, "the one" is the first surface S1 (front surface), and "the other" is the second surface S2 (back surface). The first signal line pad portions disposed on the first surface S1 of the first connection portion 51 are the front surface signal line pad portions 55A, 55B, 55C, and 55D, and the first ground pad portions disposed on the first surface S1 of the first connection portion 51 are the front surface ground pad portions 56A, 56B, 56C, 56D, and 56E. The second signal line pad portions disposed on the second surface S2 are the back surface signal line pad portions 57A, 57B, 57C, and 57D, and the second ground pad portions disposed on the second surface S2 are the back surface ground pad portions 58A, 58B, 58C, 58D, and 58E. In this case, the signal line pad portions physically contacting the first signal line conductor strips (signal line conductor strips 42A, 42B, 42C, 42D) are the first signal line pad portions, and the signal pad portions where the gap portion G is disposed between the ground conductor layer 43 and the signal pad portions are the second signal line pad portions. In the first to eighth embodiments, the distance between the first signal line pad portion and the first ground pad portion disposed on the first surface S1 is narrower than that of the second region in the first region.

In contrast, in the ninth embodiment of the present invention, the front surfaces of the flexible printed circuits 32 are connected in contact with the front surface (third surface S3) of the printed circuit board 33, and the front surfaces of the flexible printed circuits 32 are the second surfaces S2, and the back surfaces thereof are the first surfaces S1. Accordingly, the first signal line conductor strips disposed on one of the first surface S1 and the second surface S2 are the signal line conductor strips 42A, 42B, 42C, and 42D disposed on the second surface S2 which is the front surface and the first ground conductor layer disposed on the other of the first surface S1 and the second surface S2 is the ground conductor layer 43 disposed on the first surface S1 which is the back surface. That is, here, "the one" is the second surface S2 (front surface), and "the other" is the first surface S1 (back surface). The first signal line pad portions disposed on the first surface S1 of the first connection portion 51 are the back surface signal line pad portions 57A, 57B, 57C, and 57D and the first ground pad portions disposed on the first surface S1 of the first connection portion 51 are the back surface ground pad portions 58A, 58B, 58C, 58D, and 58E. The second signal line pad portions disposed on the second surface S2 are the front surface signal line pad portions 55A, 55B, 55C, and 55D, and the second ground pad portions disposed on the second surface S2 are the front surface ground pad portions 56A, 56B, 56C, 56D, and 56E. In this case, the signal line pad portions physically contacting the first signal line conductor strips (signal line conductor strips 42A, 42B, 42C, 42D) are the second signal line pad portions, and the signal pad portions where the gap portion G is disposed between the ground conductor layer 43 and the signal pad portions are the first signal line pad portions. In the ninth embodiment, the distance between the first signal line pad portion and the first ground pad portion disposed on the first surface S1 is narrower than that of the second region in the first region.

Figure 17:
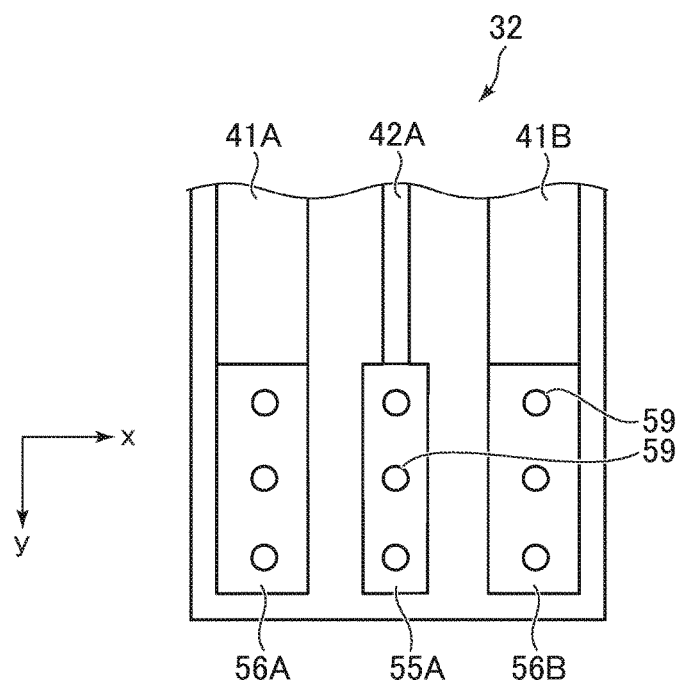
FIG. 17 is a schematic view showing a structure of first connection portions of flexible printed circuits according to a ninth embodiment of the present invention.
Figure 18:
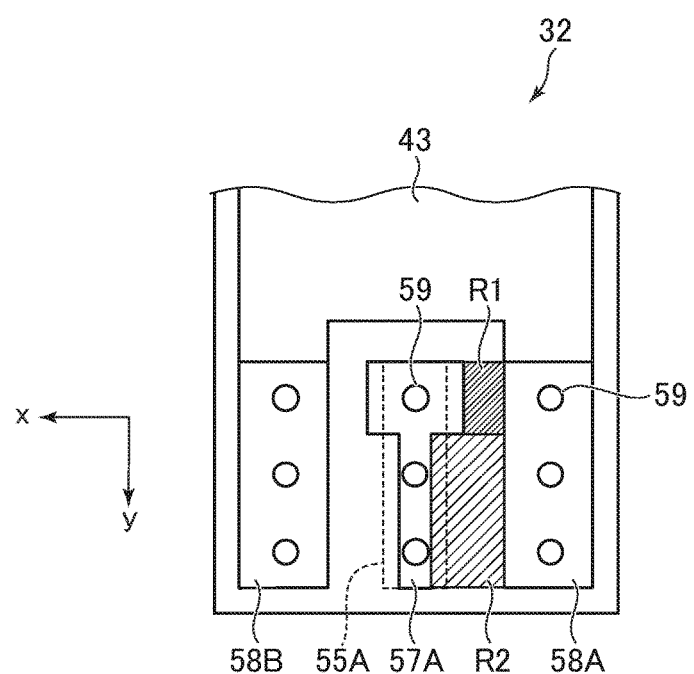
FIG. 18 is another schematic view showing the structure of the first connection portions of the flexible printed circuits according to the ninth embodiment of the present invention.

FIGS. 17 and 18 are schematic views showing the structure of the first connection portion 51 of each of the flexible printed circuits 32 according to the ninth embodiment. FIG. 17 is a view (plan view) showing the front surfaces of the flexible printed circuits 32, and FIG. 18 is a view (bottom view) showing the back surfaces of the flexible printed circuits 32. The front surface of the printed circuit board 33 is shown in FIG. 10. The first connection portion 51 according to the ninth embodiment is different from the second embodiment, but other configurations are the same. The front surfaces of the flexible printed circuits 32 are the second surfaces S2, and the front surfaces of the flexible printed circuits 32 are connected in contact with the front surface (third surface S3) of the printed circuit board 33.

As shown in FIG. 17, the front surface signal line pad portion 55A and the front surface ground pad portions 56A and 56B are connected so as to overlap the PCB signal line pad portion 72A and the PCB ground pad portions 71A and 71B, respectively. The shape of the front surface signal line pad portion 55A and the shapes of the front surface ground pad portions 56A and 56B substantially coincide with the shape of the PCB signal line pad portion 72A and the shapes of the PCB ground pad portions 71A and 71B, respectively.

As shown in FIG. 18, in the flexible printed circuits 32 according to the ninth embodiment, in the first region R1, in plan view, the edge (edge of the front surface ground pad portion 58B) of the back surface signal line pad portion 57A on the front surface ground pad portion 58A side is located outside (back surface ground pad portion 58A or 58B side) the edge (edge on the front surface ground pad portion 56B side) of the front surface signal line pad portion 55A on the front surface ground pad portion 56A side. In contrast, in the second region R2, in plan view, the edge (edge of the back surface ground pad portion 58B side) of the back surface signal line pad portion 57A on the back surface ground pad portion 58A side is located inner side (side opposite to the back surface ground pad portion 58A or 58B side) than the edge (edge on the front surface ground pad portion 56B side) of the front surface signal line pad portion 55A on the front surface ground pad portion 56A side. That is, in the back surface signal line pad portion 57A, the width of the portion adjacent to the first region R1 is wider than the width of the corresponding portion of the front surface signal line pad portion 55A in plan view. The width of the portion adjacent to the second region R2 is narrower than the width of the corresponding portion of the front surface signal line pad portion 55A in plan view. The edge of the back surface ground pad portion 58A (back surface ground pad portion 58B) on the back surface signal line pad portion 57A side is a straight line along the second direction (+y-axis direction). Accordingly, the distance between the back surface signal line pad portion 57A and the back surface ground pad portion 58A is narrower than that of the second region R2 in the first region R1.

In the first region R1, in plan view, the edge (edge of the front surface ground pad portion 58B side) of the back surface signal line pad portion 57A on the front surface ground pad portion 58A side may be located outside the edge (edge on the front surface ground pad portion 56B side) of the front surface signal line pad portion 55A on the front surface ground pad portion 56A side, the edge of the back surface ground pad portion 58A (back surface ground pad portion 58B) on the front surface signal line pad portion 57A side may be located outside the edge of the front surface ground pad portions 56A and 56B on the front surface signal line pad portion 55A side, and both of the matters described above may be allowed. In the second region R2, in plan view, the edge (edge of the front surface ground pad portion 58B) of the back surface signal line pad portion 57A on the front surface ground pad portion 58A side may be located inside the edge (edge on the front surface ground pad portion 56B side) of the front surface signal line pad portion 55A on the front surface ground pad portion 56A side, the edge of the back surface ground pad portion 58A (back surface ground pad portion 58B) on the front surface signal line pad portion 57A side may be located inside the edge of the front surface ground pad portion 56A (front surface ground pad portion 56B) on the front surface signal line pad portion 55A side, and both of the matters described above may be allowed. The condition described above may be applied to only the first region R1 or the second region R2.

Even in the case where the front surfaces of the flexible printed circuits 32 are connected in in contact with the front surfaces (third surface S3) of the printed circuit board like the flexible printed circuits 32 according to the ninth embodiment, similarly as in the first to eighth embodiments, the effect of suppressing impedance mismatching can be exhibited.

Tenth Embodiment

Figure 19:
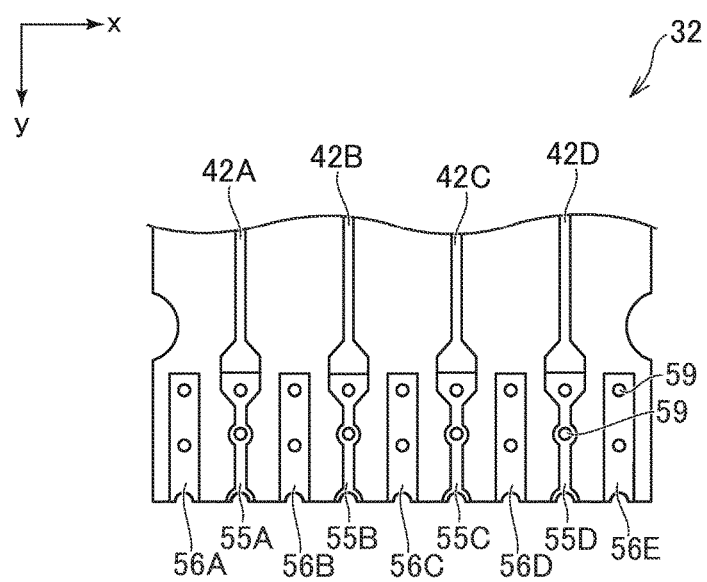
FIG. 19 is a schematic view showing a structure of flexible printed circuits according to a tenth embodiment of the present invention.

As described above, in the first to ninth embodiments, the transmission lines formed on the flexible printed circuits 32 are a coplanar line, but is not limited thereto. The transmission lines may be a microstrip lines. FIG. 19 is a schematic view showing a structure of the flexible printed circuits 32 according to a tenth embodiment of the present invention. Four (4 ch) microstrip lines are formed on the flexible printed circuits 32. A difference from the flexible printed circuits 32 shown in FIG. 4 is that the ground conductor films 41A, 41B, 41C, 41D, and 41E are not disposed on the front surfaces of the flexible printed circuits 32, and other than the difference is the same as the flexible printed circuits 32 shown in FIG. 4. For example, one microstrip line is configured to include the signal line conductor strip 42A, the ground conductor layer 43, and the dielectric layer 40. Similarly as in the second embodiment, the front surface ground pad portions 56A, 56B, 56C, 56D, and 56E according to the tenth embodiment are electrically connected with the back surface ground pad portions 58A, 58B, 58C, 58D, and 58E by being soldered with each other through the plurality of through-holes 59, respectively.

Similarly as in the first to ninth embodiments, the main features of the flexible printed circuits 32 according to the tenth embodiment are the structure in which the first signal line pad portions (here, front surface signal line pad portions 55A, 55B, 55C, and 55D) and the first ground pad portions (here, front surface ground pad portions 56A, 56B, 56C, 56D, and 56E) that are disposed on the first surface and exhibit the effect of reducing impedance mismatching.

Eleventh Embodiment

Figure 20:
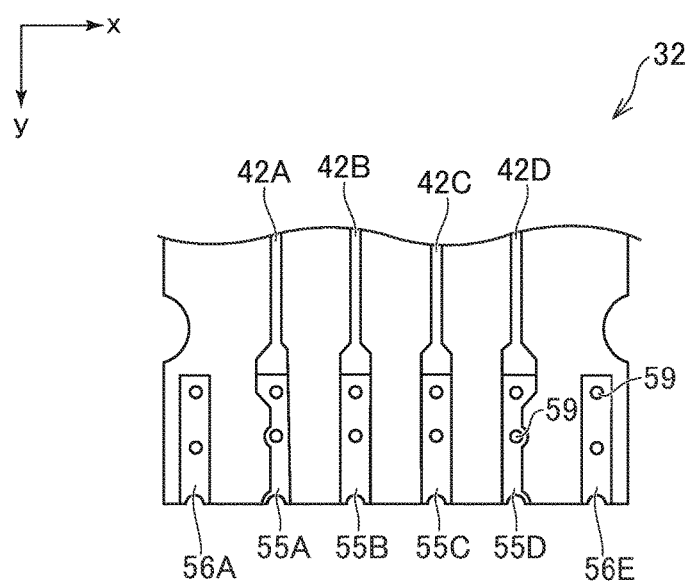
FIG. 20 is a schematic view showing a structure of flexible printed circuits according to an eleventh embodiment of the present invention.

FIG. 20 is a schematic view showing a structure of the flexible printed circuits 32 according to an eleventh embodiment of the present invention. Similarly as in the tenth embodiment, four (4 ch) microstrip lines are formed on the flexible printed circuits 32 according to the eleventh embodiment, but the structure of the ground pad portion disposed in the first connection portion 51 is different from that of the tenth embodiment. The ground pad portion is not disposed between the adjacent signal line pad portions, and the ground pad portion includes only the front surface ground pad portions 56A and 56E disposed on both sides of the entire four front surface signal line pad portions 55A, 55B, 55C, and 55D disposed in this order and the back surface ground pad portions 58A and 58E arranged on both sides of the entire four back surface signal line pad portions 57A, 57B, 57C, and 57D disposed in this order. On the front surfaces of the flexible printed circuits 32, one front surface ground pad portion 56A of two ground pad portions, four front surface signal line pad portions 55A, 55B, 55C, and 55D, and the other front surface ground pad portion 56E of the two ground pad portions are disposed to be aligned in this order. On the back surfaces of the flexible printed circuits 32, one back surface ground pad portion 58A of the two back surface ground pad portions, four back surface signal line pad portions 57A, 57B, 57C, and 57D, and the other back surface ground pad portion 58E of the two back surface ground pad portion are disposed to be aligned in this order arranged in this order. That is, the portions are arranged on a GSSSSG sequence.

Even in such a case, the second to eighth embodiments can be applied to the distance between the front surface signal line pad portion 55A and the front surface ground pad portion 56A, and the distance between the front surface signal line pad portion 55D and the front surface ground pad portion 56E. Here, in plan view, the edge (edge on the front surface ground pad portion 56B side) opposite to the front surface ground pad portion 56A of the front surface pad portion 55A is substantially coincident with the edge (edge on the back surface ground pad portion 58B side) opposite to the back surface ground pad portion 58A of the front surface pad portion 55A. The same applies to the edge (edge on the front surface ground pad portion 56D side) opposite to the front surface ground pad portion 56E of the front surface pad portion 55D. The front surface pad portions 55B and 55C are substantially coincident with the back surface pad portions 57B and 57C in plan view, respectively. Similarly as in the ninth embodiment, the same applies to a case where the front surfaces (second surface S2) of the flexible printed circuits 32 are connected in contact with the front surface (third surface S3) of the printed circuit board 33. Similarly as in the first to ninth embodiments, the effect of suppressing impedance mismatching is exhibited.

Twelfth Embodiment

As described above, the features of the flexible printed circuits 32 according to the first to tenth embodiments are the structure of the first connection portion 51 connected to the printed circuit board 33. However, the features of the flexible printed circuits 32 are not limited to the structure of the first connection portion 51, and the flexible printed circuits 32 may have the structure of the second connection portion 61 connected to the optical subassembly 31.

As shown in FIG. 3, on the front surface (third surface S3) of the feedthrough 36 of the optical subassembly 31, an OSA ground pad portion 81A, an OSA signal line pad portion 82A, an OSA ground pad portion 81B, an OSA signal line pad portion 82B, an OSA ground pad portion 81C, an OSA signal line pad portion 82C, an OSA ground pad portion 81D, an OSA signal line pad portion 82D, and an OSA ground pad portion 82E are disposed along the +x-axis direction (first direction) in this order. The OSA ground pad portions 81A, 81B, 81C, 81D, and 81E are physically in contact with OSA ground conductor films 83A, 83B, 83C, 83D, and 83E, respectively. The OSA signal line pad portions 82A, 82B, 82C, and 82D are physically in contact with OSA signal line conductor strips 84A, 84B, 84C, and 84D, respectively. Four (4 ch) coplanar lines are formed in the feedthrough 36. For example, one coplanar line is configured to include the OSA signal line conductor strip 82A and the OSA ground conductor films 81A and 82A. Each of the OSA signal line pad portions 82A, 82B, 82C, and 82D and the OSA ground pad portions 81A, 81B, 81C, 81D, and 81E have a rectangular shape extending in the −y-axis direction from the end of the feedthrough 36. Similarly as in the printed circuit board 33, the feedthrough 36 may have a multilayered structure, and the ground conductor layer (OSA ground conductor layer) may be disposed on the second metal layer.

The same structure as the first connection portion 51 according to the first to tenth embodiments can be applied to the second connection portion 61. The relationship between the second connection portion 61 and the feedthrough 36 is also similar to the relationship between the first connection portion 51 and the printed circuit board 33. Similarly as in the first to tenth embodiments, the effect of suppressing impedance mismatching is exhibited in the twelfth embodiment.

The optical module, the optical transmission equipment, and the optical transmission system according to the embodiments of the present invention have been described as above. The present invention is not limited to the embodiment described above, and various modification examples may be made thereto, and the present invention may be widely applied. It is possible to replace the configuration described in the embodiments described above with substantially the same configuration, a configuration that achieves the same operational effect, or a configuration that may achieve the same object. In the embodiments described above, in the optical subassembly 31, the optical transmitter module 23B is the TOSA and the optical element included in the optical subassembly 31 is the light-emitting element, but is not limited thereto. The optical element may be the ROSA provided in the optical receiver module 23A. In this case, the optical element provided in the optical subassembly 31 is a light-receiving element such as a photodiode. Also, the optical subassembly 31 may be a bidirectional optical subassembly (BOSA). In the embodiments described above, the shape of the second signal line pad portion and the second ground pad portion is a rectangular shape, but is not limited thereto. Any other shape may be adopted as long as it extends in the +y-axis direction.

In the embodiments described above, the coplanar line or the microstrip line is formed on each of the flexible printed circuits, but the present invention is not limited thereto. As long as the signal line pad portion and the ground pad portion are adjacent to each other on both sides of each of the flexible printed circuits, the present invention is also applicable to other transmission lines. Although the flexible printed circuits are used as examples of the connection substrates, the present invention is not limited thereto, and other connection substrates may be used.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An optical module comprising:
   an optical subassembly including one or a plurality of optical elements;
   a printed circuit board including a control circuit for controlling the one or plurality of optical elements;
   a connection substrate for connecting the optical subassembly and the printed circuit board,
   wherein the connection substrate has a first surface and a second surface, and includes:
      a first signal line conductor strip disposed on one of the first surface and the second surface;
      a first ground conductor layer disposed on the other of the first surface and the second surface, overlapped with the first signal line conductor strip, and formed to spread further outward on both sides of the first signal line conductor strip; and
   a first connection portion connected to one of the printed circuit board and the optical subassembly on the second surface,
   wherein the first connection portion includes:
      a first signal line pad portion disposed on the first surface;
      a first ground pad portion disposed adjacent to the first signal line pad portion on the first surface;
      a second signal line pad portion disposed on the second surface and electrically connected to the first signal line pad portion; and
      a second ground pad portion disposed adjacent to the second signal line pad portion on the second surface and electrically connected to the first ground pad portion,
   wherein the first signal line conductor strip is physically in contact with one of the first signal line pad portion and the second signal line pad portion, being disposed on the one of the first surface and the second surface,
   wherein the ground conductor layer is physically in contact with one of the first ground pad portion and the second ground pad portion, being disposed on the other of the first surface and the second surface,
   wherein the connection substrate includes a gap portion electrically isolating from the ground conductor layer the other of the first signal line pad portion and the second signal line pad portion, being disposed on the other of the first surface and the second surface, and
   wherein a distance between the first signal line pad portion and the first ground pad portion in a first region is narrower than that in a second region that is farther from an inner end portion on the gap portion side than the first region in plan view.

2. The optical module according to claim 1, wherein an edge of the first signal line pad portion is located outside an edge of the second signal line pad portion in the first region in plan view.

3. The optical module according to claim 1, wherein the edge of the first signal line pad portion is located inside the edge of the second signal line pad portion in the second region in plan view.

4. The optical module according to claim 1, wherein an edge of the first ground pad portion is located outside an edge of the second ground pad portion in the first region in plan view.

5. The optical module according to claim 1, wherein the edge of the first ground pad portion is located inside the edge of the second ground pad portion in the second region in plan view.

6. The optical module according to claim 1, wherein the one of the printed circuit board and the optical subassembly has a third surface opposed to the first surface of the connection substrate, and includes:
   a third signal line pad portion disposed on the third surface and connected in contact with the second signal pad portion; and
   a third ground pad portion disposed on the third surface and connected in contact with the second ground pad portion,
wherein a shape of the second signal line pad portion corresponds to a shape of the third signal pad portion and the second signal line pad portion is connected so as to overlap the third signal pad portion, and
wherein a shape of the second ground pad portion corresponds to a shape of the third ground pad portion and the second ground pad portion is connected so as to overlap the third ground pad portion.

7. The optical module according to claim 6,
wherein both the second signal line pad portion and the second ground pad portion have a rectangular shape.

8. The optical module according to claim 1,
wherein the connection substrate further includes a plurality of the first signal line conductor strips disposed on the one of the first surface and the second surface,
wherein in the first connection portion,
a plurality of the first signal line pad portions disposed on the first surface,
a plurality of the first ground pad portions disposed on the first surface,
a plurality of the second signal line pad portions disposed on the second surface, and
a plurality of the second ground pad portions disposed on the second surface are provided,
wherein the first signal line pad portion and the first ground pad portion are disposed repeatedly a plurality of times to be aligned in this order on the first surface,
wherein the second signal line pad portion and the second ground pad portion are disposed repeatedly a plurality of times to be aligned in this order on the second surface,
wherein the plurality of the first signal line pad portions are electrically connected to the plurality of the second signal line pad portions, respectively,
wherein the plurality of the first ground pad portions are electrically connected to the plurality of the second ground pad portions, respectively,
wherein the plurality of the first signal line conductor strips are physically in contact with one of the plurality of the first signal line pad portions and the plurality of the second signal line pad portions, being disposed on the one of the first surface and the second surface, respectively,
wherein the ground conductor layer is physically in contact with one of the plurality of the first ground pad portions and the plurality of the second ground pad portions, being disposed on the other of the first surface and the second surface,
wherein the connection substrate further includes a plurality of the gap portions electrically isolating from the ground conductor layer the other of the plurality of the first signal line pad portions and the plurality of the second signal line pad portions from the ground conductor layer, being disposed on the other of the first surface and the second surface,
and
wherein each of distances between the first signal line pad portions and the first ground pad portions adjacent to each other in a first region is narrower than that in a second region that is farther from an inner end portion on the gap portion side than the first region in plan view.

9. The optical module according to claim 1,
wherein the connection substrate further includes a plurality of the first signal line conductor strips disposed on the one of the first surface and the second surface,
wherein in the first connection portion,
a plurality of the first signal line pad portions disposed on the first surface,
two of the first ground pad portions disposed on the first surface,
a plurality of the second signal line pad portions disposed on the second surface, and
two of the second ground pad portions disposed on the second surface are provided,
wherein one of the two of the first ground pad portions, the plurality of first signal line pad portions, and the other of the two of the first ground pad portions are disposed to be aligned in this order on the first surface,
wherein one of the two of the second ground pad portions, the plurality of second signal line pad portions, and the other of the two of the second ground pad portions are disposed to be aligned in this order on the second surface,
wherein the plurality of the first signal line pad portions are electrically connected to the plurality of the second signal line pad portions, respectively,
wherein the two of the first ground pad portions are electrically connected to the two of the second ground pad portions, respectively,
wherein the plurality of the first signal line conductor strips are physically in contact with one of the plurality of the first signal line pad portions and the plurality of the second signal line pad portions, being disposed on the one of the first surface and the second surface, respectively,
wherein the ground conductor layer is physically in contact with one of the two of the first ground pad portions and the two of the second ground pad portions, being disposed on the other of the first surface and the second surface,
wherein the connection substrate further includes a plurality of the gap portions electrically isolating from the ground conductor layer the other of the plurality of the first signal line pad portions and the plurality of the second signal line pad portions, being disposed on the other of the first surface and the second surface, respectively, and
wherein each of distances between the first signal line pad portions and the first ground pad portions adjacent to each other in a first region is narrower than that in a second region that is farther from an inner end portion on the gap portion side than the first region in plan view.

10. An optical transmission equipment on which the optical module according to claim 1 is mounted.

* * * * *